US012418266B2

(12) United States Patent
Ayranci et al.

(10) Patent No.: US 12,418,266 B2
(45) Date of Patent: Sep. 16, 2025

(54) WIDEBAND COUPLED INPUT IMPEDANCE MATCHING LNA ARCHITECTURE

(71) Applicant: Murata Manufacturing Co., Ltd., Kyoto (JP)

(72) Inventors: Emre Ayranci, Costa Mesa, CA (US); Mengsheng Rui, San Diego, CA (US); Phanindra Yerramilli, San Diego, CA (US); Jubaid Qayyum, San Diego, CA (US); Vijay Katta, San Diego, CA (US); Miles Sanner, San Diego, CA (US)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 692 days.

(21) Appl. No.: 17/855,443

(22) Filed: Jun. 30, 2022

(65) Prior Publication Data

US 2024/0007060 A1   Jan. 4, 2024

(51) Int. Cl.
*H03F 1/22* (2006.01)
*H03F 1/56* (2006.01)
*H03F 3/195* (2006.01)
*H03F 3/72* (2006.01)

(52) U.S. Cl.
CPC ............ *H03F 1/565* (2013.01); *H03F 3/195* (2013.01); *H03F 3/72* (2013.01); *H03F 2200/294* (2013.01); *H03F 2200/451* (2013.01); *H03F 2203/7236* (2013.01)

(58) Field of Classification Search
CPC ..................................... H03F 1/22; H03F 9/00
USPC ................................. 330/311, 310, 165, 276
See application file for complete search history.

(56) References Cited

U.S. PATENT DOCUMENTS

| | | |
|---|---|---|
| 2014/0240048 A1 | 8/2014 | Youssef et al. |
| 2015/0123732 A1 | 5/2015 | Hoogzaad et al. |
| 2017/0179894 A1 | 6/2017 | Jin et al. |
| 2019/0074862 A1 | 3/2019 | Wang et al. |
| 2019/0190560 A1 | 6/2019 | Reja et al. |

OTHER PUBLICATIONS

Ayranci, et al. "Wideband Multi-Gain LNA Architecture", patent application filed in the USPTO on Jun. 2, 2021, U.S. Appl. No. 17/337,227, 46 pgs.
Lee, Kang Ha, International Search Report and Written Opinion received from the KIPO dated Oct. 6, 2023 for appln. No. PCT/US2023/025609, 10 pgs.

*Primary Examiner* — Henry Choe
(74) *Attorney, Agent, or Firm* — Steinfl + Bruno LLP

(57) ABSTRACT

Circuits and methods for a radio frequency amplifier, such as an LNA, that include a wideband coupled input impedance matching network. One embodiment includes a first inductor coupled between a first terminal and a first node, the first terminal couplable to a degeneration terminal of an amplifier core; a second inductor coupled between a second terminal and either the first node or a second node, the second terminal couplable to an input terminal of the amplifier core; a third inductor coupled between the first node and a third terminal, the third terminal couplable to a reference potential; and, in a variant embodiment, a fourth inductor coupled between the second node and a fourth terminal, the fourth terminal couplable to the reference potential; wherein the first inductor and the second inductor are mutually coupled. Some embodiments allow multiple modes to allow tradeoffs of gain versus linearity and NF characteristics.

10 Claims, 19 Drawing Sheets

WIDEBAND COUPLED INPUT IMPEDANCE MATCHING LNA ARCHITECTURE

BACKGROUND

(1) Technical Field

The invention relates to electronic circuits, and more particularly to radio frequency amplifier circuits.

(2) Background

Many modern electronic systems include radio frequency (RF) receivers; examples include cellular telephones, personal computers, tablet computers, wireless network components, televisions, cable system "set top" boxes, and radar systems. Many RF receivers are paired with RF transmitters in the form of transceivers, which often are quite complex two-way radios. In some cases, RF transceivers are capable of transmitting and receiving across multiple frequencies in multiple bands.

Amplifiers are a common component in RF transmitters, receivers, and transceivers, and are frequently used for power amplification of transmitted RF signals and for low-noise amplification of received RF signals. For many RF systems, particularly those requiring low power and/or portability (e.g., cellular telephones, WiFi-connected computers, cameras, and other devices), it has become common to use complementary metal-oxide semiconductor (CMOS) fabrication technology to create low cost, low power integrated circuits (ICs). CMOS devices include bulk CMOS, silicon-on-insulator (SOI) CMOS, and silicon-on-sapphire (SOS) CMOS (SOS being a type of SOI fabrication technology).

Receiving an RF signal in many environments requires a high quality low-noise amplifier (LNA) as part of an RF "front end" (RFFE) receiver or transceiver chain of circuits. Important desired characteristics of an LNA are high gain with low noise, a wide bandwidth, good linearity, and good input and output impedance matching. However, in general, all of these factors cannot be optimized simultaneously, and accordingly there are tradeoffs between these characteristics when designing an LNA.

Five important design parameters for LNAs are gain, noise figure (NF), input-referenced third intercept point (IIP3), output reflection coefficient, and input reflection coefficient. NF is a measure of degradation of the signal-to-noise ratio (SNR) caused by components in a signal chain, with lower values indicating better performance. IIP3 is a figure of merit representing amplifier linearity, with higher values indicating better performance. In general, NF has a stricter specification requirement in high-gain modes than in low gain-modes, while IIP3 has a stricter specification requirement in low-gain modes than in high-gain modes. The output reflection coefficient is the S22 scattering parameter (or "S-parameter") and is an indication of output impedance matching, with lower (more negative, when evaluated logarithmically) numbers indicating better impedance matching. The input reflection coefficient is the S11 S-parameter and is an indication of input impedance matching, with lower (more negative, when evaluated logarithmically) numbers indicating better performance.

Increases in the frequency of RF communications bands and channels, as well as a continuing increase in the number of bands and channels in use, has pushed current LNA architectures to their limits. For example, achieving stringent requirements for gain, percentage bandwidth, linearity, and input and output impedance matching with a traditional LNA architecture is difficult, and sometimes impossible, for some of the new 5G mobile network bands, particularly in the 3 to 6 GHz NR bands, the upcoming 7-24 GHz bands, and the millimeter wave range (e.g., 24.25 GHz to 52.6 GHz), owing to insufficient wideband performance.

Wideband LNAs present several design challenges. For example, achieving effective wideband impedance matching at the input of an LNA is a key objective for attaining overall performance, especially NF. Known approaches to input impedance (IM) matching involve using a series inductor or series-inductor/shunt inductor combination between an LNA input terminal and the amplification core (e.g., a cascode transistor pair) but those solutions have limited bandwidth. Multi-stage IM matching comes with other trade-offs, mainly in terms of a lower NF and additional manufacturing cost and integrated circuit (IC) die area.

Accordingly, there is a need for an LNA architecture that overcomes the limitations of conventional LNA architectures.

SUMMARY

The present invention encompasses circuits and methods for a high frequency LNA that include a wideband coupled input impedance matching network. Some embodiments allow multiple modes of operation to allow selection of gain versus linearity and NF characteristics. The inventive circuits and methods may also be applied to other types of amplifiers, such as power amplifiers.

A first embodiment includes a wideband input impedance matching network including: a first inductor coupled between a first terminal and a first node, the first terminal configured to be coupled to a degeneration terminal of an amplifier core; a second inductor coupled between a second terminal and the first node, the second terminal configured to be coupled to an input terminal of the amplifier core; and a third inductor coupled between the first node and a third terminal, the third terminal configured to be coupled to a reference potential; wherein the first inductor and the second inductor are mutually coupled.

A second embodiment includes a wideband input impedance matching network including: a first inductor coupled between a first terminal and a first node, the first terminal configured to be coupled to a degeneration terminal of an amplifier core; a second inductor coupled between a second terminal and a second node, the second terminal configured to be coupled to an input terminal of the amplifier core; a third inductor coupled between the first node and a third terminal, the third terminal configured to be coupled to a reference potential; and a fourth inductor coupled between the second node and a fourth terminal, the fourth terminal configured to be coupled to the reference potential; wherein the first inductor and the second inductor are mutually coupled.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

The present invention encompasses circuits and methods for a high frequency LNA that include a wideband coupled input impedance matching network. Some embodiments allow multiple modes of operation to allow selection of gain versus linearity and NF characteristics. The inventive circuits and methods may also be applied to other types of amplifiers, such as power amplifiers.

Bandwidth Terms

For purposes of this disclosure, "narrowband", "wideband" and "ultra-wideband" may be characterized as a percentage fractional bandwidth equal to (stop frequency $f_{STOP}$ minus start frequency $f_{START}$) divided by the center frequency $f_{CENTER}$ of a band, or $(f_{STOP}-f_{START})/f_{CENTER}$ (expressed as a percent, where $f_{CENTER}=(f_{STOP}+f_{START})/2$. TABLE 1 below shows typical guidelines (not strict definitions) for characterizing typical percentage bandwidths.

TABLE 1

| Nominal Band Name | % bandwidth range |
| --- | --- |
| Narrowband | <7.5% |
| Extended Narrowband | 7.5%~15% |
| Wideband | 15%~25% |
| Ultra-wideband | >25% |

TABLE 2 below provides examples of common cellular telephone bands and their characterization as wideband or ultra-wideband using the guidelines in TABLE 1.

TABLE 2

| Typical Application | $f_{START}$ (GHZ) | $f_{STOP}$ (GHz) | $f_{CENTER}$ (GHZ) | % Bandwidth |
|---|---|---|---|---|
| Wideband (N77) | 3.3 | 4.2 | 3.75 | 24.00% |
| Wideband (N96) | 5.925 | 7.125 | 6.525 | 18.39% |
| Ultra-Wideband (UWB) | 6.2 | 9 | 7.6 | 36.84% |

First Embodiment

Figure 1:
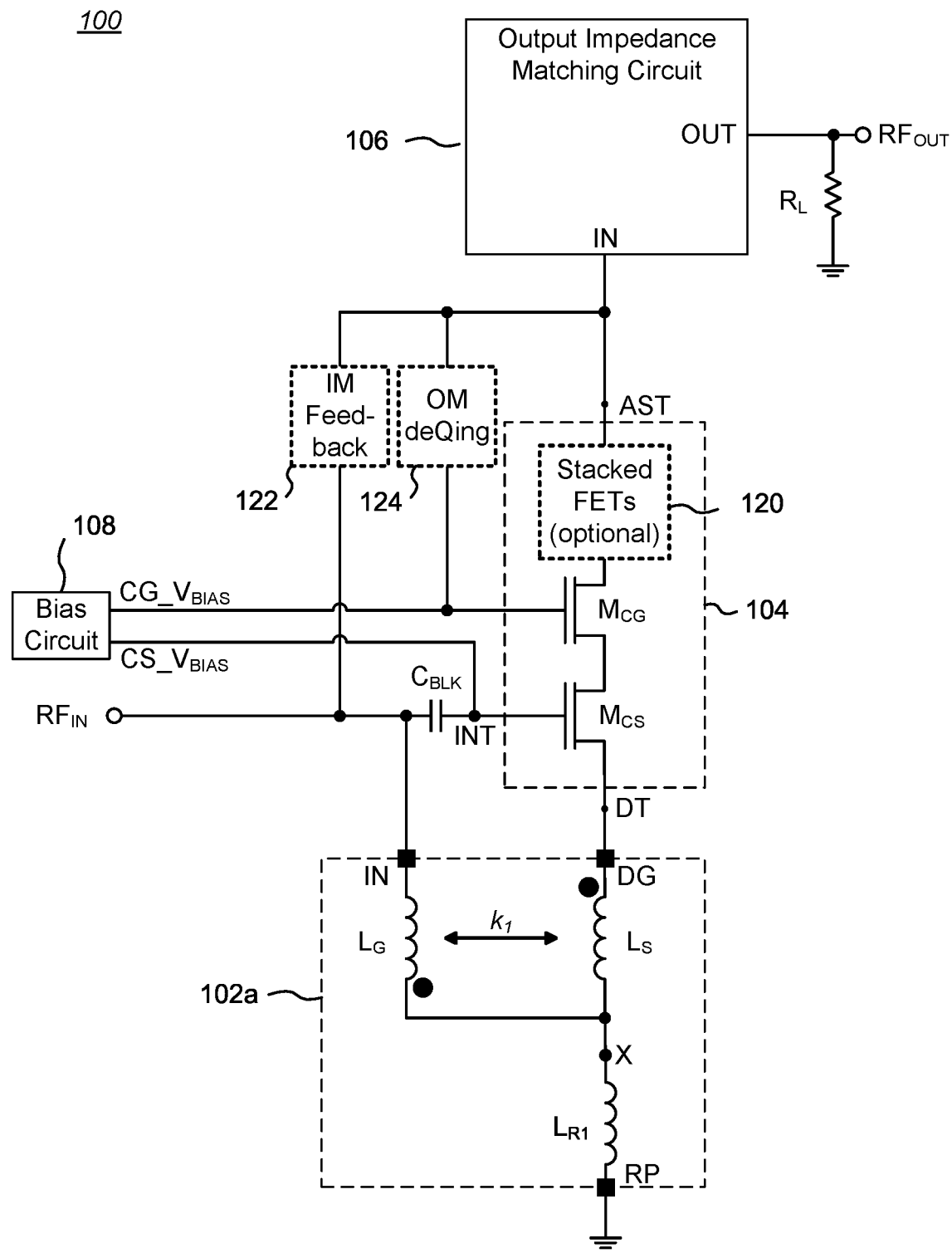
FIG. 1 is a simplified schematic diagram of a first embodiment of an LNA circuit having a wideband coupled input impedance matching network.

FIG. 1 is a simplified schematic diagram of a first embodiment of an LNA circuit 100 having a wideband coupled input impedance matching network 102a.

In the illustrated example, the LNA circuit 100 includes an amplifier core 104 comprising a stack of two series-connected FETs $M_{CS}$, $M_{CG}$ in a cascode arrangement. An RF input signal applied to an RF input terminal $RF_{IN}$ is coupled through a DC blocking capacitor $C_{BLK}$ to the control gate of the common-source FET $M_{CS}$, which may be regarded as an input terminal INT of the amplification core 104.

The source of the common-gate FET $M_{CG}$ is connected to the drain of the common-source FET $M_{CS}$. The drain of the common-gate FET $M_{CG}$ provides an amplified RF output signal at what may be regarded as an amplified-signal terminal AST of the amplification core 104.

An output impedance matching (OIM) network 106 has an IN terminal configured to be coupled to the amplified-signal terminal AST of the amplification core 104, and an OUT terminal configured to be coupled to an RF output terminal $R_{OUT}$. The amplified output of the amplification core 104 is coupled through the OIM network 106 to the RF output terminal $R_{OUT}$, which is shown coupled to a typical load represented as a resistor $R_L$. The value of $R_L$ is typically 50 ohms for many modern RF circuits.

A bias circuit 108 is configured to provide a suitable bias voltage $CG\_V_{BIAS}$ to the common-gate FET $M_{CG}$ and a suitable bias voltage $CS\_V_{BIAS}$ to the common-source FET $M_{CS}$, in known fashion. Additional well-known circuit elements that might be included in some applications, such as bypass capacitors, are omitted for clarity.

The wideband coupled input impedance matching (WCIIM) network 102a includes an RP terminal configured to be coupled to a reference potential (e.g., circuit ground), a DG terminal configured to be coupled to the degeneration terminal DT of the amplification core 104, and an IN terminal configured to be coupled to the input terminal INT of the amplification core 104 through the capacitor $C_{BLK}$. In the illustrated embodiment, the WCIIM network 102a includes a pair of mutually coupled inductors $L_S$ and $L_G$. Source inductor $L_S$ is coupled between the DG terminal (and thus couplable to the degeneration terminal DT of the amplification core 104) and a node X, and functions at least in part as a degeneration inductor. Gate inductor $L_G$ is coupled between the IN terminal (and thus couplable to the input terminal INT of the amplification core 104) and node X. The opposite-side placement of the "dots" adjacent the symbols representing $L_S$ and $L_G$ indicates that the coupling is negative. However, in alternative embodiments, the coupling may be positive—that is, the dots would be on the same sides of the symbols representing $L_S$ and $L_G$.

The two principal inductors $L_G$ and $L_S$ are laid out such they exhibit a mutual inductance with a coupling factor $k_1$ and may be implemented, for example, as a coupled segments of a multiport integrated circuit inductor coil. The mutual inductance between $L_G$ and $L_S$ creates a feedback current to the input terminal INT of the amplification core 104 which achieves wideband input matching with a minimal impact on NF.

The illustrated WCIIM network 102a also includes a third inductor $L_{R1}$ symbol coupled between node X (and thus to both $L_G$ and $L_S$) and the RP terminal (and thus couplable to a reference potential, such as circuit ground). The third inductor $L_{R1}$ represents the inductance inherent to the conductive routing traces from an IC embodiment of the LNA 100 to the ground plane of a module in which the IC is affixed. Since there is control at the design stage of the layout of the conductive routing traces that comprise the third inductor $L_{R1}$, the inductance value of $L_{R1}$ may be set to further adjust the mutual inductance of $L_G$ and $L_S$ for particular applications.

Second Embodiment

Figure 2:
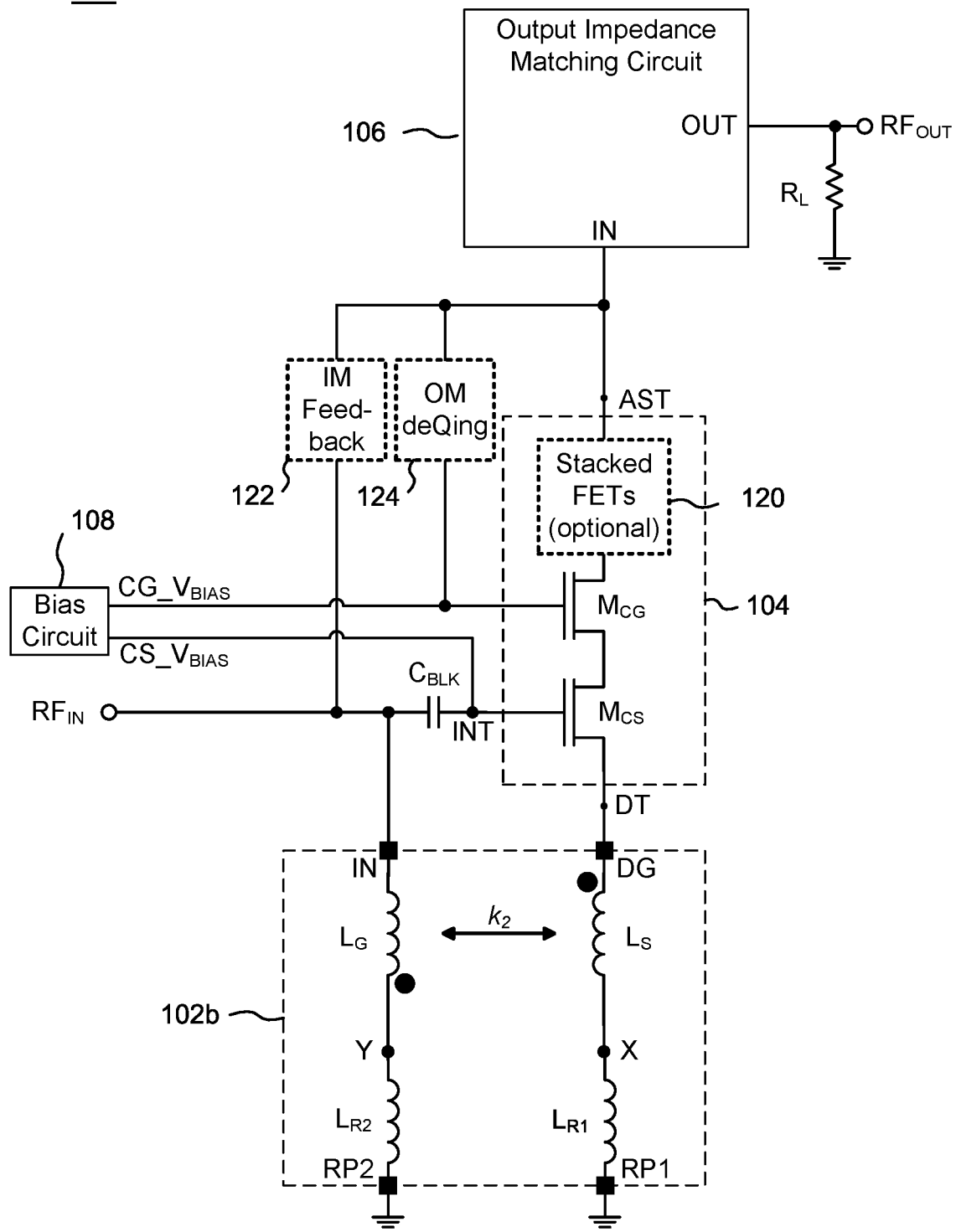
FIG. 2 is a simplified schematic diagram of a second embodiment of an LNA circuit having a wideband coupled input impedance matching network.

FIG. 2 is a simplified schematic diagram of a second embodiment of an LNA circuit 200 having a wideband coupled input impedance matching network 102b. The LNA circuit 200 is similar in most respects to the LNA circuit 100 of FIG. 1 but includes a variant WCIIM network 102b.

The WCIIM network 102b includes separate RP1 and RP2 terminals configured to be coupled to a reference potential (e.g., circuit ground), a DG terminal configured to be coupled to the degeneration terminal DT of the amplification core 104, and an IN terminal configured to be coupled to the input terminal INT of the amplification core 104 through the capacitor $C_{BLK}$. In the illustrated embodiment, the WCIIM network 102b includes a pair of mutually coupled inductors $L_S$ and $L_G$. Source inductor $L_S$ is coupled between the DG terminal (and thus couplable to the degeneration terminal DT of the amplification core 104) and a node X, and functions at least in part as a degeneration inductor. Gate inductor $L_G$ is coupled between the IN terminal (and thus couplable to the input terminal INT of the amplification core 104) and node Y. The two principal inductors $L_G$ and $L_S$ are laid out such they exhibit a mutual inductance with a coupling factor $k_2$ and may be implemented, for example, as coupled segments of a multiport integrated circuit inductor coil. The mutual inductance between $L_G$ and $L_S$ creates a feedback current to the input terminal INT of the amplification core 104 which achieves wideband input matching with a minimal impact on NF.

The illustrated WCIIM network 102 also includes a third inductor $L_{R1}$ coupled between node X (and thus to $L_S$) and the RP1 terminal (and thus couplable to a reference potential, such as circuit ground), and a fourth inductor $L_{R2}$ coupled between node Y (and thus to $L_G$) and the RP2 terminal (and thus couplable to the reference potential). The third and fourth inductors $L_{R1}$, $L_{R2}$ represent the inductance inherent to the respective conductive routing traces from an IC embodiment of the LNA 100 to the ground plane of a module in which the IC is affixed. Of note, $L_{R1}$ and $L_{R2}$ are generally not mutually coupled in the illustrated embodiment. Since there is control at the design stage of the layout of the conductive routing traces that comprise the third and fourth inductors $L_{R1}$, $L_{R2}$ their respective inductance values may be set to further adjust the mutual inductance of $L_G$ and $L_S$ for particular applications.

One challenge in implementing on-die mutually coupled inductors (also known as a transformer) is achieving a transformer having a high coupling factor k (k=M/=$\sqrt{L_G L_S}$, where M is mutual inductance) and a high turn ratio n (n= $\sqrt{L_G/L_S}$). However, by separating the common connection of $L_S$ and $L_G$ and separately connecting $L_S$ and $L_G$ to the reference potential through $L_{R1}$ and $L_{R2}$ respectively, more design freedom is available for transformer layout to achieve a high $k_2$.

Performance Examples

Figure 3A:
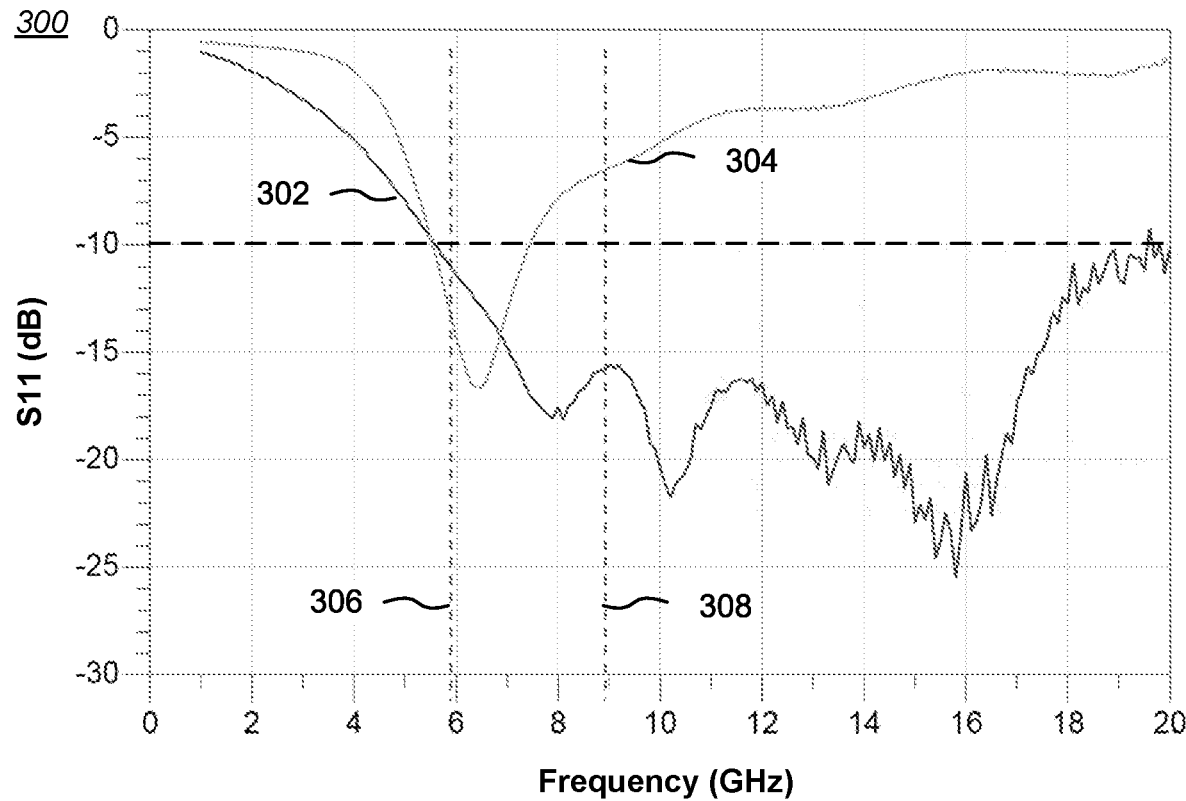
FIG. 3A is a graph of measured S11 versus frequency performance for an embodiment like LNA of FIG. 1 in comparison to a conventional LNA having a series-inductor/shunt inductor combination between an RF input terminal and an amplification core.

FIG. 3A is a graph 300 of measured S11 versus frequency performance for an embodiment like LNA 100 of FIG. 1 in comparison to a conventional LNA having a series-inductor/shunt inductor combination between an RF input terminal and an amplification core 104. Graph line 302 corresponds to the LNA 100, while graph line 304 corresponds to the conventional LNA. Both embodiments were designed for optimal performance between about 6 GHz and about 9 GHz (that range is indicated by dashed lines 306 and 308); as examination of graph 300 shows, the LNA 100 architecture exhibits better average S11 performance in that frequency interval.

Figure 3B:
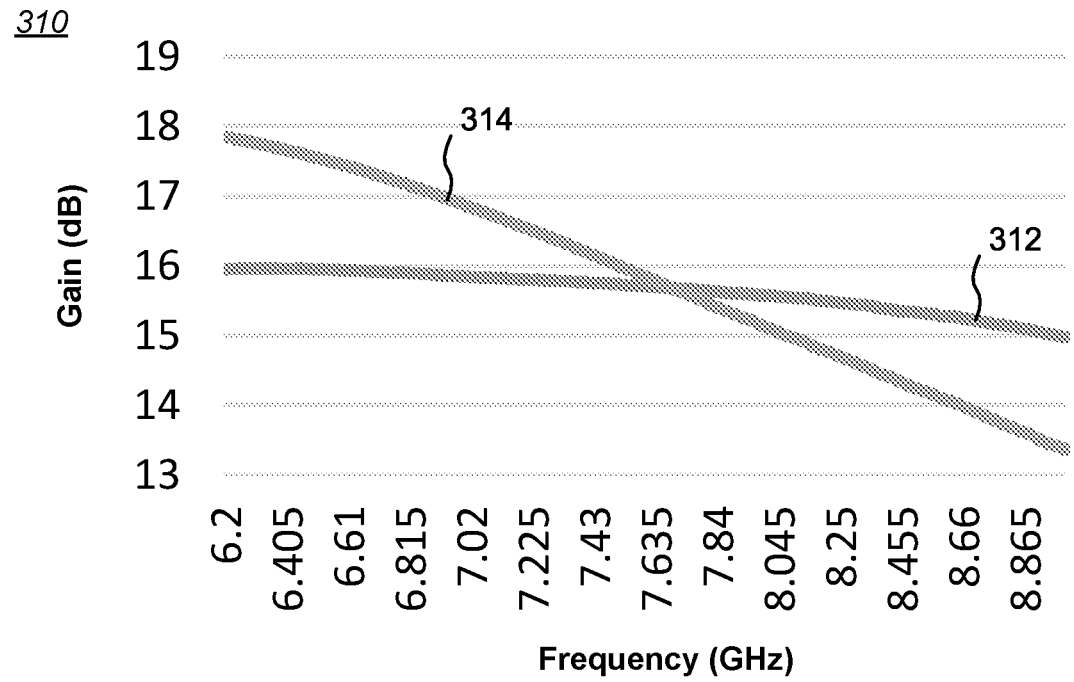
FIG. 3B is a graph of measured gain versus frequency performance for an embodiment like LNA of FIG. 1 in comparison to a conventional LNA having a series-inductor/shunt inductor combination between an RF input terminal and an amplification core.

FIG. 3B is a graph 310 of measured gain versus frequency performance for an embodiment like LNA 100 of FIG. 1 in comparison to a conventional LNA having a series-inductor/shunt inductor combination between an RF input terminal and an amplification core 104. Graph line 312 corresponds to the LNA 100, while graph line 314 corresponds to the conventional LNA. In the 6-9 GHz frequency interval, the LNA 100 architecture exhibits flatter gain performance with better minimum gain in the example frequency interval.

As between the LNA 100 and the conventional LNA, the NF performance (not shown) is comparable, with the LNA 100 generally exhibiting somewhat flatter performance and better average performance in the example frequency interval.

Figure 4A:
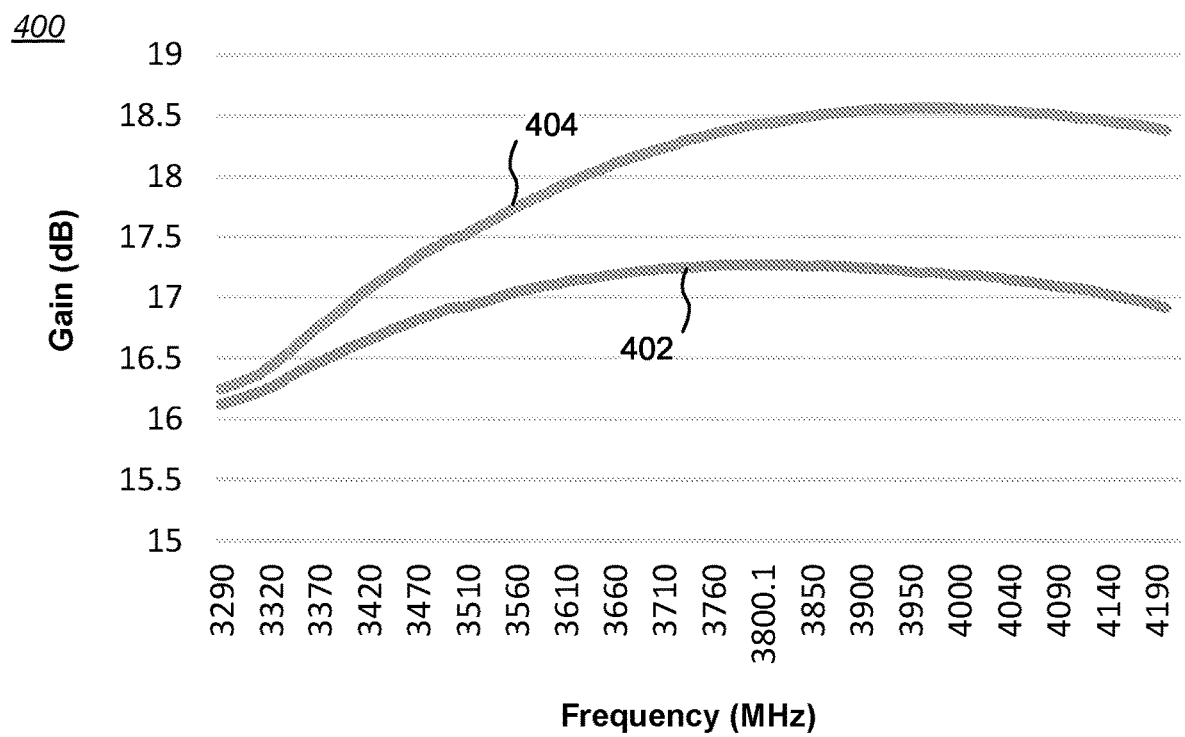
FIG. 4A is a graph of measured gain versus frequency performance for an embodiment like LNA of FIG. 1 (with common connection of $L_S$ and $L_G$) in comparison to an embodiment like LNA of FIG. 2 (with separate ground connections for $L_S$ and $L_G$).

FIG. 4A is a graph 400 of measured gain versus frequency performance for an embodiment like LNA 100 of FIG. 1 (with common connection of $L_S$ and $L_G$) in comparison to an embodiment like LNA 200 of FIG. 2 (with separate ground connections for $L_S$ and $L_G$). Graph line 402 corresponds to the LNA 100 embodiment, while graph line 404 corresponds to the LNA 200 embodiment, which exhibits higher gain over the example frequency interval (corresponding to the 5G N77 band).

Figure 4B:
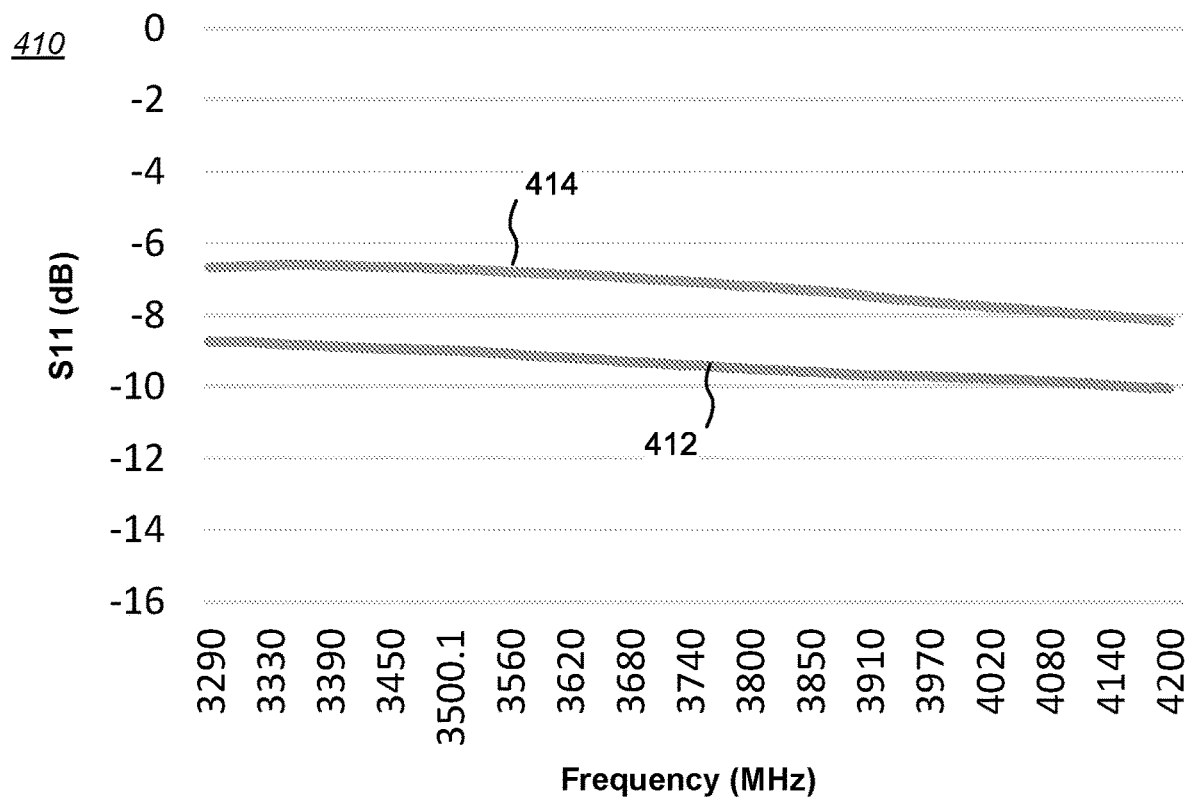
FIG. 4B is a graph of measured S11 versus frequency performance for an embodiment like LNA of FIG. 1 in comparison to an embodiment like LNA of FIG. 2.

FIG. 4B is a graph 410 of measured S11 versus frequency performance for an embodiment like LNA 100 of FIG. 1 in comparison to an embodiment like LNA 200 of FIG. 2. Graph line 412 corresponds to the LNA 100 embodiment, while graph line 414 corresponds to the LNA 200 embodiment, which exhibits somewhat higher S11 over the example frequency interval.

Figure 4C:
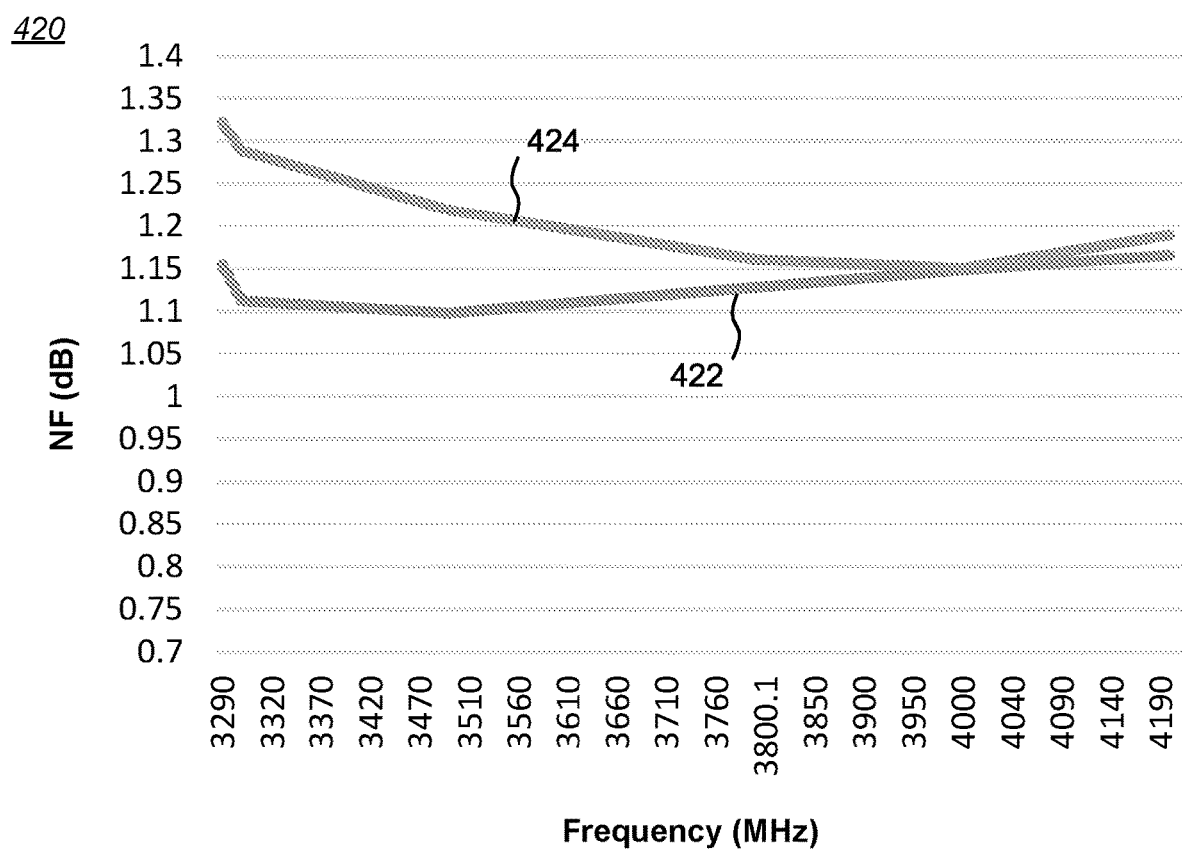
FIG. 4C is a graph of measured NF versus frequency performance for an embodiment like LNA of FIG. 1 in comparison to an embodiment like LNA of FIG. 2.

FIG. 4C is a graph 420 of measured NF versus frequency performance for an embodiment like LNA 100 of FIG. 1 in comparison to an embodiment like LNA 200 of FIG. 2. Lower NF values indicate better performance. Graph line 422 corresponds to the LNA 100 embodiment, while graph line 424 corresponds to the LNA 200 embodiment, which exhibits somewhat higher average NF over the example frequency interval.

In this example, the LNA 100 needs more coupling on the IC to offset the opposite coupling on the module; the separate ground connections of the LNA 200 overcomes that issue and achieves higher gain, but with some trade-offs with respect to S11 and NF performance. It should be appreciated that either architecture may be used for any particular application, with performance trade-offs among gain, S11, and NF as may be needed to meet an applicable specification.

Compared to input impedance matching circuits having only a series-inductor or a series-inductor/shunt inductor combination between an LNA input terminal and the amplification core, the new impedance matching input architectures described in this disclosure have the following benefits: IC area savings, manufacturing cost savings, wider impedance matching bandwidth, and flatter gain response.

IC to Module Connection and Mutual Coupling Options

Figure 5A:
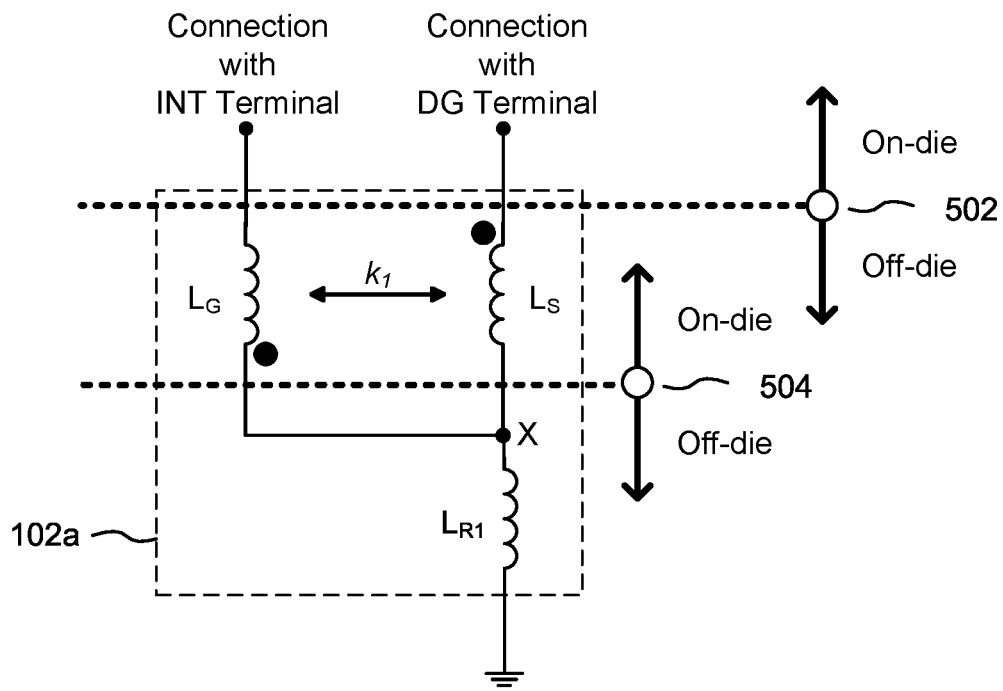
FIG. 5A is a schematic diagram of the LNA from FIG. 1, showing two possible demarcation lines between fabricating WCIIM network circuit components either on-die or off-die (e.g., within a circuit module in which an LNA die is affixed).

Integrated circuit embodiments of the LNA circuits 100, 200 may take advantage of a number of different possible circuit layouts for trading-off inductor coupling and IC area. For example, FIG. 5A is a schematic diagram of the LNA 100 from FIG. 1, showing two possible demarcation lines between fabricating WCIIM network 102a circuit components either on-die or off-die (e.g., within a circuit module in which an LNA die is affixed) with respect to the amplifier core 104. In a first configuration 502, the mutually-coupled inductors $L_G$, $L_S$ and the common inductor $L_{R1}$ are located off-die with respect to the amplifier core 104, thus saving IC area. In a second configuration 504, the mutually-coupled inductors $L_G$, $L_S$ are fabricated on-die (i.e., co-fabricated with the amplifier core 104), while the common inductor $L_{R1}$ (which essentially is always present due to routing requirements) is located off-die with respect to the amplifier core 104. In the second illustrated configuration, coupling is negative on the IC and positive off-die (e.g., in the module). Having the coupling on-die generally gives more control over the design characteristics.

Figure 5B:
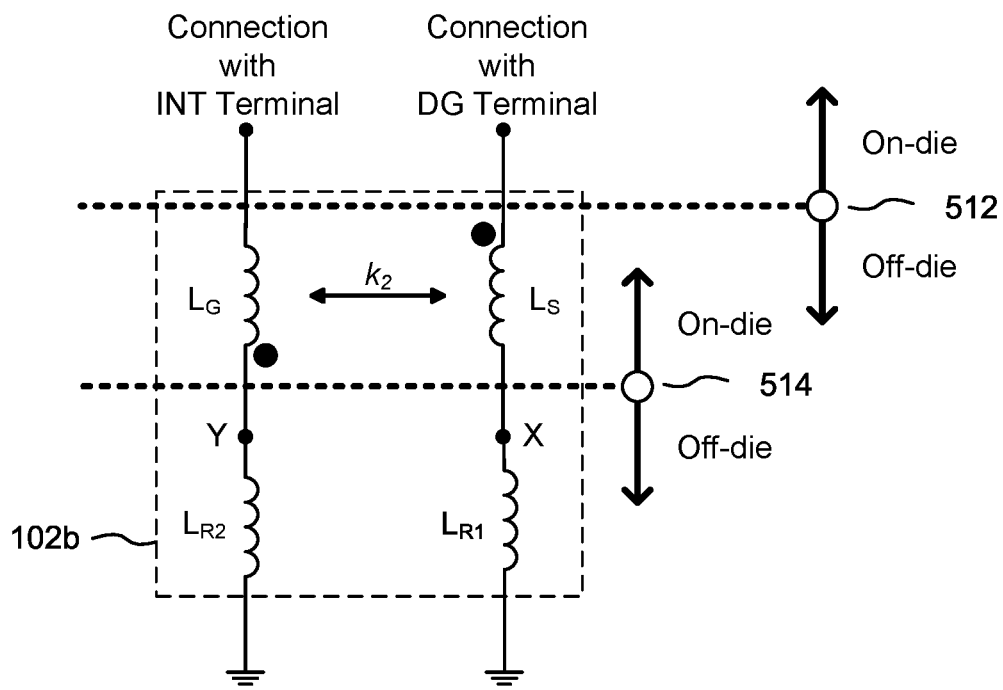
FIG. 5B is a schematic diagram of the LNA from FIG. 2, showing two possible demarcation lines between fabricating WCIIM network circuit components either on-die or off-die.

As another example, FIG. 5B is a schematic diagram of the LNA 200 from FIG. 2, showing two possible demarcation lines between fabricating WCIIM network 102b circuit components either on-die or off-die. In a first configuration 512, the mutually-coupled inductors $L_G$, $L_S$ and the separate inductors $L_{R1}$, $L_{R2}$ are fabricated off-die, thus saving IC area. In a second configuration 514, the mutually-coupled inductors $L_G$, $L_S$ are fabricated on-die, while the separate inductors $L_{R1}$, $L_{R2}$ are fabricated off-die. In the second illustrated configuration, coupling is negative on the IC and negligible off-die (e.g., in the module). Having the coupling on-die generally gives more control over the design characteristics.

Alternative Embodiments

Figure 6A:
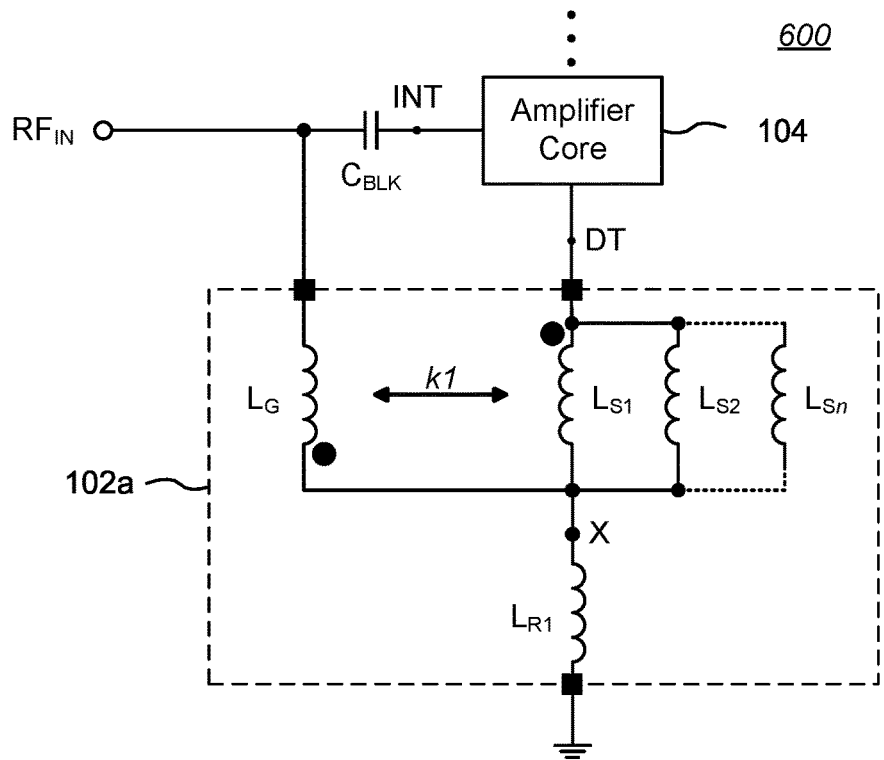
FIG. 6A is a schematic diagram of a portion of the LNA of FIG. 1 showing a second method of achieving a high coupling factor k that is particularly useful when the inductance of $L_S$ is significantly small (e.g., about 0.3 nH) compared to the inductance of $L_G$ (e.g., about 4 nH).
Figure 6B:
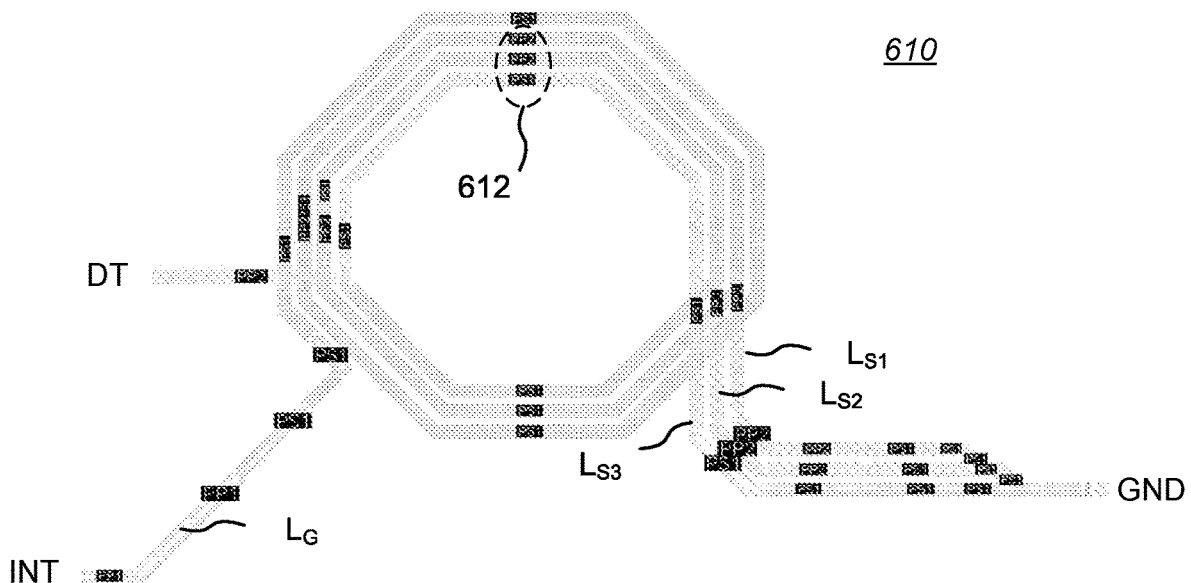
FIG. 6B is a top plan view of an example IC transformer coil in which inductor $L_G$ comprises nearly four turns of the transformer coil, while inductors $L_{S1}$, $L_{S2}$, $L_{S3}$ each comprise about one-half of a turn of the transformer coil.

The present invention encompasses a number of alternative embodiments. For example, FIG. 6A is a schematic diagram of a portion 600 of the LNA 100 of FIG. 1 showing a second method of achieving a high coupling factor k that is particularly useful when the inductance of $L_S$ is significantly small (e.g., about 0.3 nH) compared to the inductance of $L_G$ (e.g., about 4 nH). As shown in FIG. 6A, the single inductor $L_S$ of FIG. 1 is replaced by multiple parallel inductors $L_{S1}$, $L_{S2}$, ... $L_{Sn}$, where n≥2. The multiple parallel inductors may be implemented using mutually-coupled parallel single-turn inductors instead of using a conventional multi-turn single inductor. For example, FIG. 6B is a top plan view of an example IC transformer coil 610 in which inductor $L_G$ comprises nearly four turns of the transformer coil 610, while inductors $L_{S1}$, $L_{S2}$, $L_{S3}$ each comprise about one-half of a turn of the transformer coil 610. Note that in the region encompassed by the dashed oval 612, the conductive traces of inductors $L_{S1}$, $L_{S2}$, $L_{S3}$ overlay the conductive traces of inductor $L_G$. The resulting layout of the coupled inductors within the WCIIM network 102a is beneficially compact for IC fabrication. The configuration of multiple parallel inductors $L_{S1}, L_{S2}, \ldots L_{Sn}$ may also be used in conjunction with the LNA 200 of FIG. 2. The concepts shown in FIGS. 6A and 6B may also be applied to the LNA 200 of FIG. 2, along with comparable LNAs.

Figure 7:
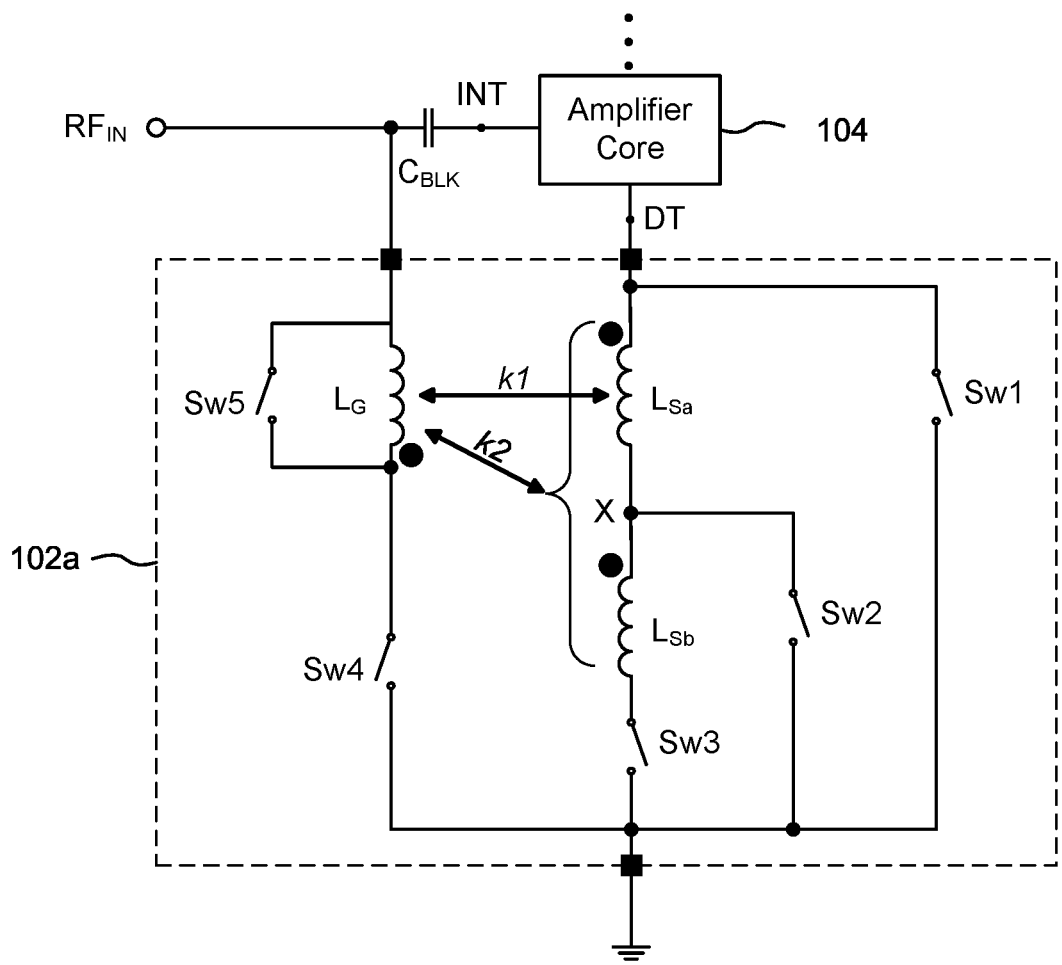
FIG. 7 is a schematic diagram of a portion of the LNA of FIG. 1 showing a switchable configuration for the WCIIM network.

FIG. 7 is a schematic diagram of a portion 700 of the LNA 100 of FIG. 1 showing a switchable configuration for the WCIIM network 102a. In the illustrated embodiment, the source inductor $L_S$ of FIG. 1 is "split" to include two transformer coils, $L_{Sa}$ and $L_{Sb}$, that can be switchable coupled to inductor $L_G$. Also included are a set of switches that enable different configurations of the WCIIM network 102a—more specifically, a first switch Sw1 coupled between the degeneration terminal DT and circuit ground (as one example of a reference voltage), a second switch Sw2 coupled between node X and circuit ground, a third switch Sw3 coupled between inductor $L_{Sb}$ and circuit ground, and a fourth switch Sw4 coupled between inductor $L_G$ and circuit ground. Omitted to avoid clutter is the inductance inherent to the conductive routing traces from an IC embodiment of the LNA 100 to the ground plane of a module in which the IC is affixed. The concepts shown in FIG. 7 may also be applied to the LNA 200 of FIG. 2, along with comparable LNAs.

The illustrated architecture may be configured for different modes that trade off gain against linearity. For example, TABLE 3 below provides just a few examples of switch positions and resulting modes achievable with the switchable configuration for the WCIIM network 102a. In the table, "O" means a switch is set to an OPEN (non-conducting) state, "X" means a switch is set to a CLOSED (conducting) state, and "-" means a switch may be set to OPEN or CLOSED as desired for a particular application. As should be appreciated, other combinations of switch configurations are possible.

bypass $L_{Sb}$). In a second topology, if low-loss switches are not available, Sw3 may be omitted. This helps improve the Q of the serial combination of $L_{Sa}+L_{Sb}$ when Sw2 is OPEN. The configuration of a split, switchable $L_S$ inductor may also be used in conjunction with the LNA 200 of FIG. 2.

Figure 8:
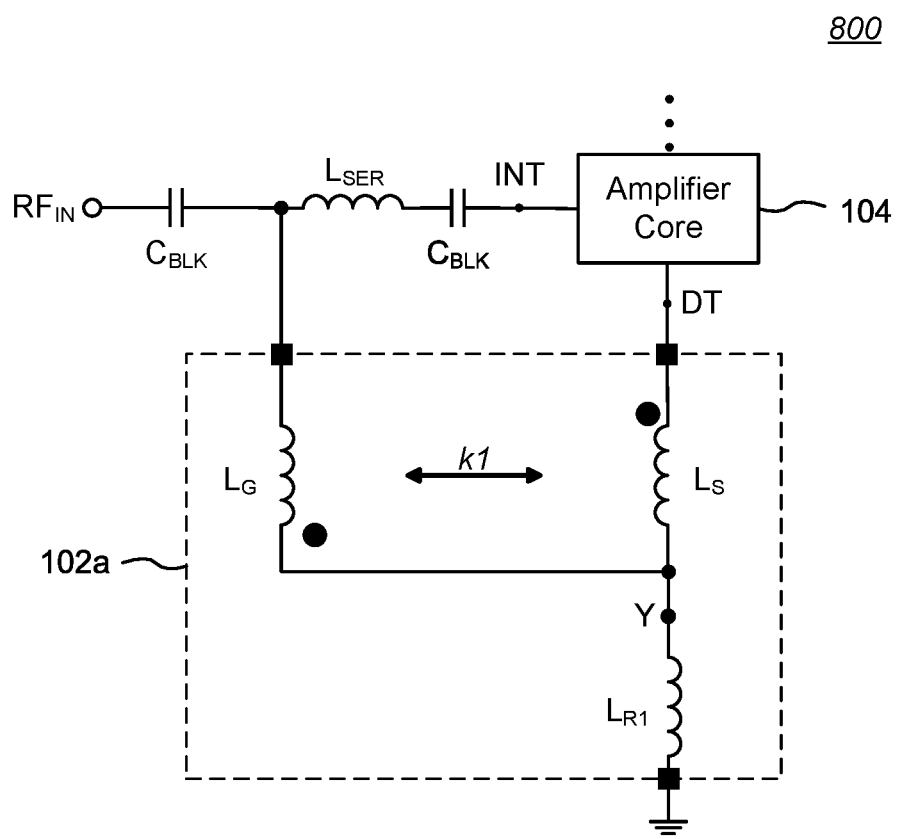
FIG. 8 is a schematic diagram of a portion of the LNA of FIG. 1 showing the WCIIM network coupled to the INT terminal through a series inductance $L_{SER}$.

FIG. 8 is a schematic diagram of a portion 800 of the LNA 100 of FIG. 1 showing the WCIIM network 102a coupled to the INT terminal through a series inductance $L_{SER}$ and a DC blocking capacitor $C_{BLK}$. More specifically, the inductor $L_{SER}$ is coupled to the input terminal INT of the amplification core 104 through a DC blocking capacitor $C_{BLK}$ (the location of $C_{BLK}$ and $L_{SER}$ can be swapped), and to the inductor $L_G$ of the WCIIM network 102a such that feedback from the WCIIM network 102a flows through $L_{SER}$. This architecture helps input impedance matching with an additional degree of freedom and improves both gain and NF. A series inductance $L_{SER}$ may also be used in conjunction with the LNA 200 of FIG. 2, along with comparable LNAs.

For example, FIGS. 9A-9E are graphs of various LNA parameter values as a function of frequency for an embodiment like LNA 100 of FIG. 1 (with common connection of $L_S$ and $L_G$) where the LNA includes a WCIIM network 102a coupled to the INT terminal through a series inductance $L_{SER}$ and a DC blocking capacitor $C_{BLK}$ (the "$L_{SER}$ embodiment") and for a similar LNA embodiment that lacks $L_{SER}$ ((the "non-$L_{SER}$ embodiment"). The LNA embodiments in this example are designed for the 5-7 GHz 5G New Radio Unlicensed (NR-U) cellular radio spectrum. The illustrated graphs show that gain, S11, S22, and NF can be improved concurrently with the inclusion of the $L_{SER}$ inductance.

Figure 9A:
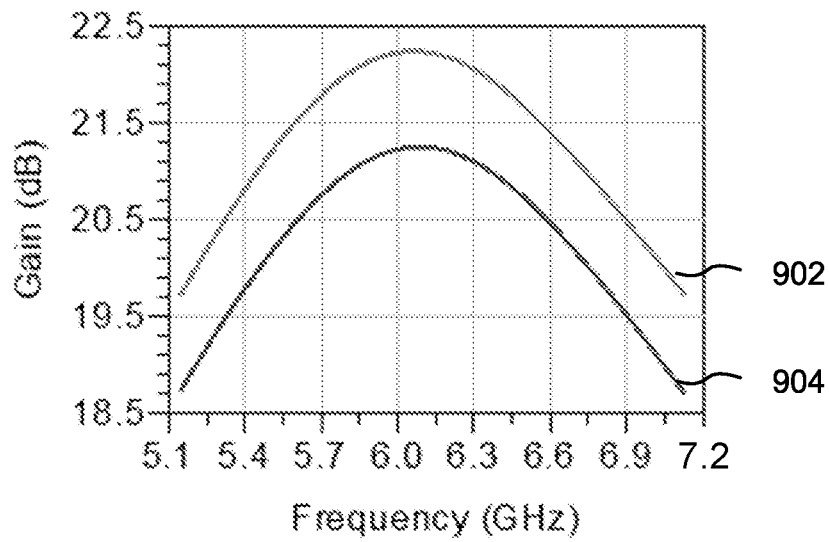
FIG. 9A is a graph of simulated gain versus frequency performance for the $L_{SER}$ embodiment in comparison to the non-$L_{SER}$ embodiment.

FIG. 9A is a graph 900 of simulated gain versus frequency performance for the $L_{SER}$ embodiment (graph line 902) in comparison to the non-$L_{SER}$ embodiment (graph line 904). An increase in the series inductance at the input improves

TABLE 3

| Mode | Sw1 | Sw2 | Sw3 | Sw4 | Sw5 | Observations |
|---|---|---|---|---|---|---|
| High gain | O | X | O | X | O | Inductors $L_G$ and $L_{Sa}$ are coupled with a coupling factor k1. |
| Low gain | O | O | X | X | O | Inductors $L_G$ and $L_{Sa} + L_{Sb}$ (i.e., the series sum of the inductances) are coupled with a coupling factor k2. Depending on the value and layout of $L_{Sb}$, the turn ratio and coupling factor can be adjusted for different gain and linearity tradeoffs. This is especially useful in a very low current and very low gain mode, where linearity is more important. |
| Alt. Mode 1 | — | — | — | O | X | Inductor $L_G$ is essentially deactivated (electrically disconnected), with no feedback connection to the INT terminal. |
| Alt. Mode 2 | X | O | O | X | O | Inductors $L_{Sa} + L_{Sb}$ are essentially deactivated (bypassed) |
| Alt. Mode 3 | X | O | O | O | X | Inductor $L_G$ is essentially deactivated (electrically disconnected), with no feedback connection to the INT terminal, and inductors $L_{Sa} + L_{Sb}$ are essentially deactivated (bypassed) |

Depending on different application scenarios, switch Sw3 may be omitted (thus connecting $L_{Sb}$ to circuit ground) for different tradeoffs. For example, in a first topology, if low-loss switches are available and the Q of $L_{Sa}$ is important, then switch Sw3 may be included in series with $L_{Sb}$ as shown in FIG. 7. This helps improve the Q of $L_{Sa}$ when Sw2 is CLOSED and Sw3 is OPEN, since Sw3 prevents signal from flowing through $L_{Sb}$ (noting that actual FET implementations of Sw2 will not present as an ideal short with zero resistance, so closing Sw2 would not completely the Q of the input matching network, and thus improves overall LNA gain. Accordingly, the $L_{SER}$ embodiment exhibits higher gain over the example frequency interval.

Figure 9B:
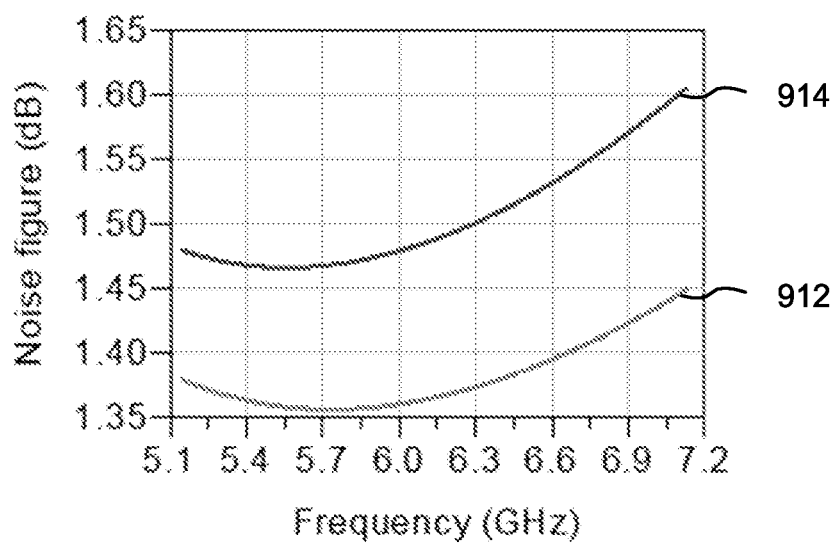
FIG. 9B is a graph of simulated NF versus frequency performance for the $L_{SER}$ embodiment in comparison to the non-$L_{SER}$ embodiment.

FIG. 9B is a graph 910 of simulated NF versus frequency performance for the $L_{SER}$ embodiment (graph line 912) in comparison to the non-$L_{SER}$ embodiment (graph line 914). Lower NF values indicate better performance. The $L_{SER}$ embodiment exhibits lower NF over the example frequency interval.

Figure 9C:
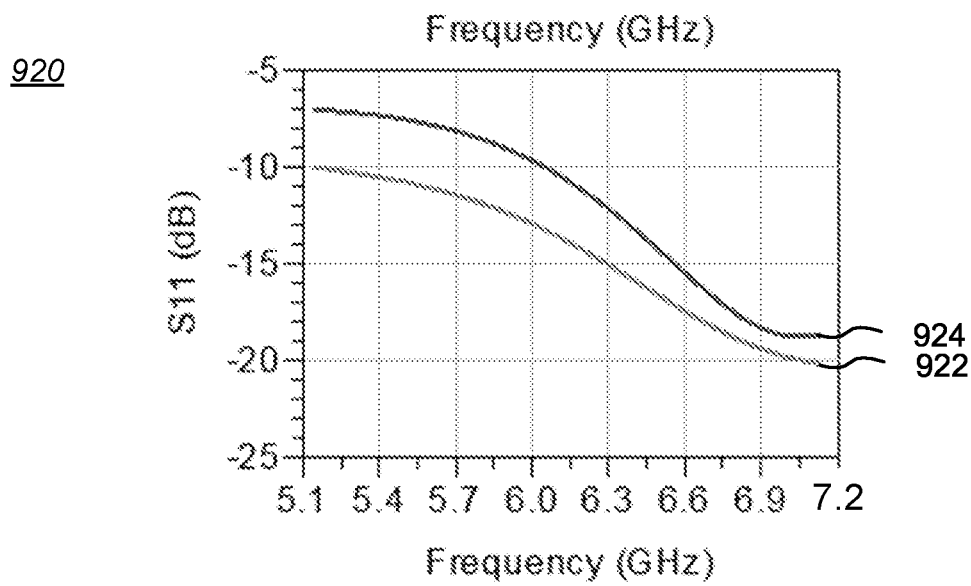
FIG. 9C is a graph of simulated S11 versus frequency performance for the $L_{SER}$ embodiment in comparison to the non-$L_{SER}$ embodiment.

FIG. 9C is a graph 920 of simulated S11 versus frequency performance for the $L_{SER}$ embodiment (graph line 922) in comparison to the non-$L_{SER}$ embodiment (graph line 924). Lower S11 values indicate better performance. The $L_{SER}$ embodiment exhibits lower S11 over the example frequency interval.

Figure 9D:
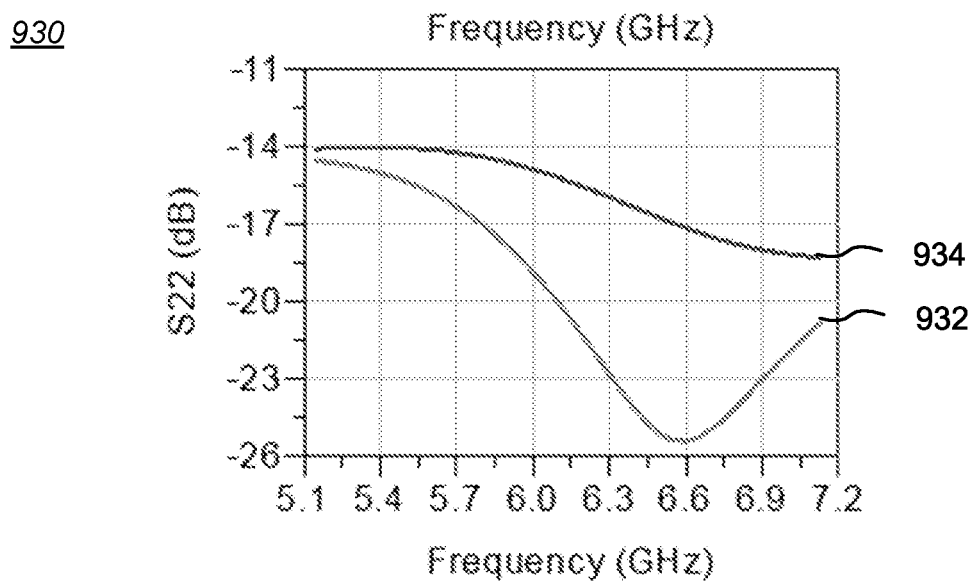
FIG. 9D is a graph of simulated S22 versus frequency performance for the $L_{SER}$ embodiment in comparison to the non-$L_{SER}$ embodiment.

FIG. 9D is a graph 930 of simulated S22 versus frequency performance for the $L_{SER}$ embodiment (graph line 932) in comparison to the non-$L_{SER}$ embodiment (graph line 934). Lower S22 values indicate better performance. The $L_{SER}$ embodiment exhibits lower S22 over the example frequency interval.

Figure 9E:
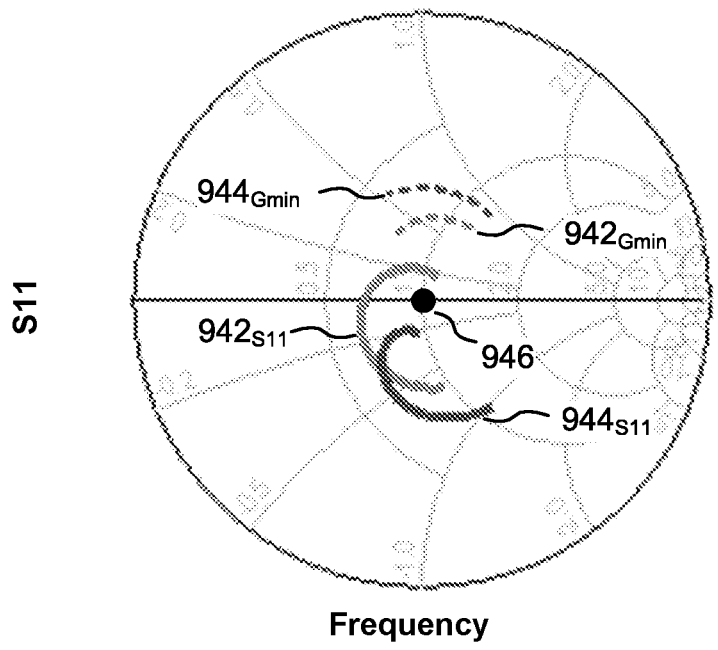
FIG. 9E is a Smith chart of simulated S11 and optimum noise reflection coefficient Gmin versus frequency performance for the $L_{SER}$ embodiment in comparison to the non-$L_{SER}$ embodiment.

FIG. 9E is a Smith chart 940 of simulated S11 and optimum noise reflection coefficient Gmin versus frequency performance for the $L_{SER}$ embodiment (graph lines $942_S11$ and $942_{Gmin}$) in comparison to the non-$L_{SER}$ embodiment (graph lines $944_S11$ and $944_{Gmin}$). As the Smith chart 940 shows, the inclusion of the $L_{SER}$ inductance causes the S11 (graph line $942_S11$) for the $L_{SER}$ embodiment to be closer to the center 946 of the chart (indicating better S11 performance than the non-$L_{SER}$ embodiment). Concurrently, the inclusion of the $L_{SER}$ inductance causes the Gmin (graph line $942_{Gmin}$) for the $L_{SER}$ embodiment to be closer to the center 946 of the chart (indicating better noise matching than the non-$L_{SER}$ embodiment).

Figure 9F:
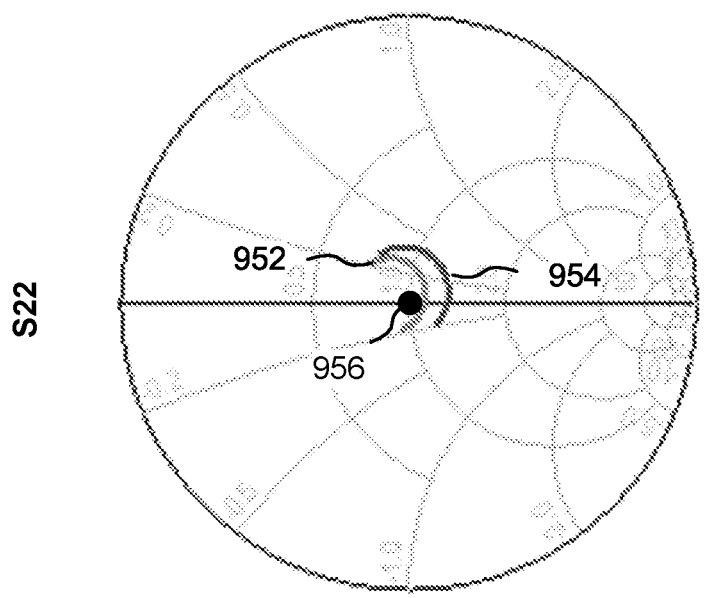
FIG. 9F is a Smith chart of simulated S22 versus frequency performance for the $L_{SER}$ embodiment in comparison to the non-$L_{SER}$ embodiment.

FIG. 9F is a Smith chart 950 of simulated S22 versus frequency performance for the $L_{SER}$ embodiment (graph line 952) in comparison to the non-$L_{SER}$ embodiment (graph line 954). As the Smith chart 950 shows, the inclusion of the $L_{SER}$ inductance places the S22 (graph line 952) for the $L_{SER}$ embodiment closer to the center 956 of the chart (indicating better S22 performance than the non-$L_{SER}$ embodiment).

Optional Circuit Elements

A. Output Impedance Matching Circuits. The OIM network 106 of the above-described LNA circuits may be implemented in a number of ways that contribute to wideband operation.

Figure 10A:
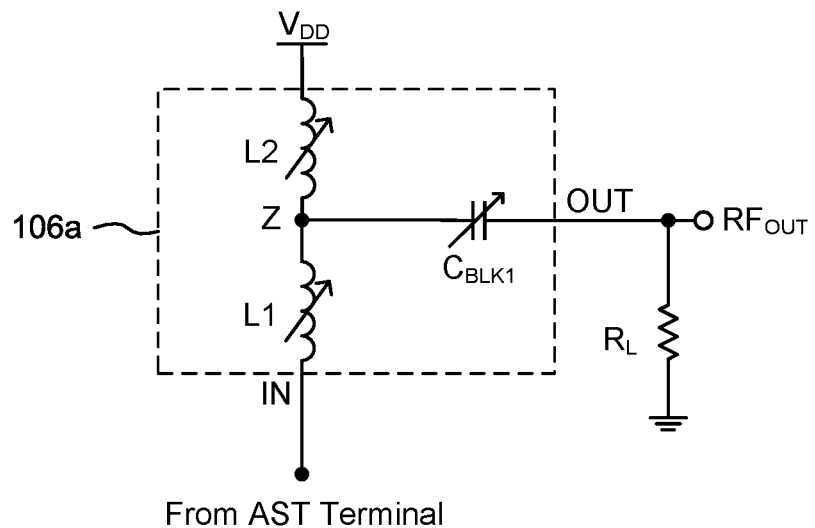
FIG. 10A is schematic diagram of a first output impedance matching (OIM) network that may be used in conjunction with the LNA circuits of the present disclosure.

For example, FIG. 10A is schematic diagram of a first output impedance matching (OIM) network 106a that may be used in conjunction with the LNA circuits 100, 200 of the present disclosure. The OIM network 106a includes a first inductor L1 coupled in series with a second inductor L2 at a node Z, with the pair of inductors L1, L2 coupled to the IN terminal of the OIM network 106a and configured to be coupled to a power supply $V_{DD}$. A DC blocking capacitor $C_{BLK1}$ is coupled between node Z and the OUT terminal of the OIM network 106a, which in turn is coupled to the $R_{OUT}$ terminal. Any of the inductors L1, L2 and capacitor $C_{BLK1}$ may be adjustable components, as shown, or have fixed values.

Figure 10B:
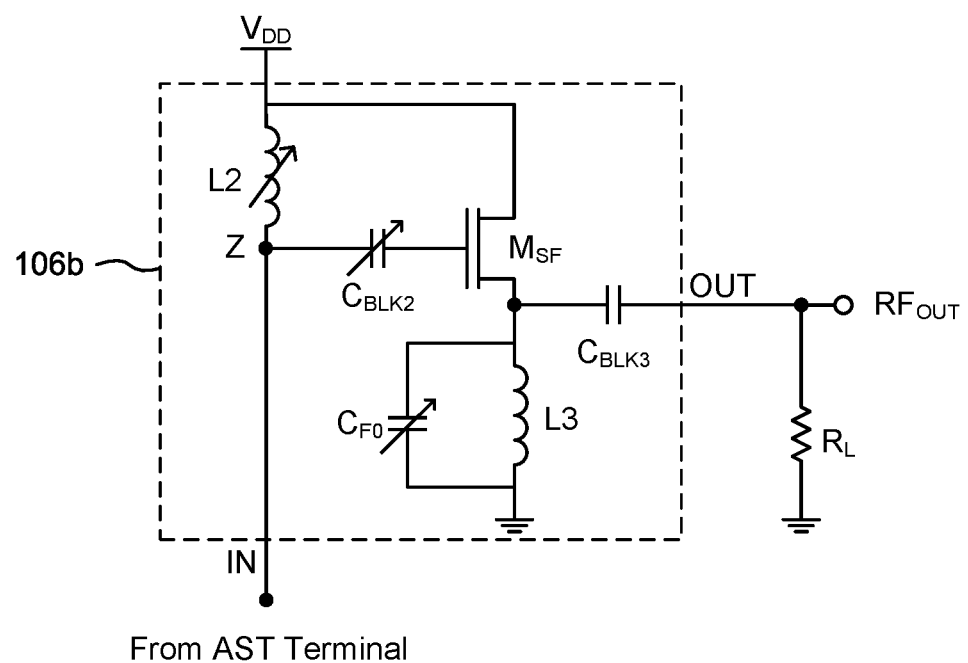
FIG. 10B is schematic diagram of a second OIM network that may be used in conjunction with the LNA circuits of the present disclosure.

As another example, FIG. 10B is schematic diagram of a second OIM network 106b that may be used in conjunction with the LNA circuits 100, 200 of the present disclosure. The OIM network 106b includes an inductor L2 coupled to the IN terminal of the OIM network 106b and configured to be coupled to a power supply $V_{DD}$. A DC blocking capacitor $C_{BLK2}$ is coupled between the amplified-signal terminal AST of the amplification core 104 and the control gate of a second-stage FET $M_{SF}$, which provides a second stage of amplification as a source-follower circuit. In the illustrated example, the second-stage FET $M_{SF}$ has a conduction channel (drain to source) coupled between $V_{DD}$ and an inductor L3, which in turn is coupled to a reference potential, such as circuit ground. The source of the second-stage FET $M_{SF}$ is coupled through a DC blocking capacitor $C_{BLK3}$ to the OUT terminal of the OIM network 106b, which in turn is coupled to the $RF_{OUT}$ terminal. Some embodiments may include a capacitor $C_{F0}$ coupled in parallel with the inductor L3. Any of the inductors L2, L3 and capacitors $C_{BLK2}$, $C_{BLK3}$, $C_{F0}$ may be adjustable components, as shown, or have fixed values.

B. Stack of FETS. In some embodiments, in order to overcome a relatively low breakdown voltage per CMOS FET, multiple common-gate FETS may be series-coupled in a FET stack 120 between the drain of the bottom-most common-gate FET $M_{CG}$ and the amplified-signal terminal AST, as shown in FIGS. 1 and 2—that is, the amplification core 104 may have multiple series-coupled common-gate FETs in a cascode configuration. The amplified-signal terminal AST would then be at the drain of the upper-most common-gate FET in the amplification core 104.

C. Input Matching Feedback Circuit. Some embodiments may include an input matching (IM) feedback circuit 122. The IM feedback circuit 122 is shown in FIGS. 1 and 2 as coupled between the input terminal INT and the amplified-signal terminal AST. More generally, the IM feedback circuit 122 may be coupled to a feedback node in the output signal path of the amplification core 104, which may be the drain of any of the FETS in the amplification core 104 (including within a FET stack 120). The choice of feedback node for connection to the IM feedback circuit 122 may be made, for example, based on different desired feedback strength and different desired input impedance.

Figure 11:
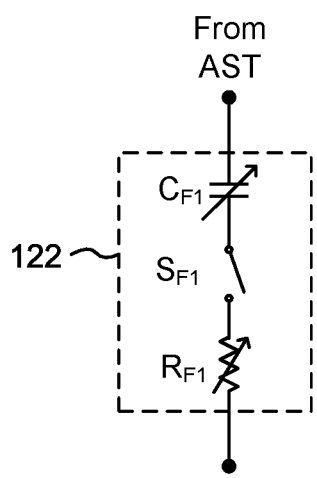
FIG. 11 is a schematic diagram of one embodiment of an input matching feedback circuit.

FIG. 11 is a schematic diagram of one embodiment of an input matching feedback circuit 122. The IM feedback circuit 122 in the illustrated example comprises a DC blocking capacitor $C_{F1}$ series-coupled with a switch $S_{F1}$, which in turn is series-coupled to a resistor $R_{F1}$. In some embodiments, $C_{F1}$ and/or $R_{F1}$ may be adjustable, as shown, or have fixed values. In alternative embodiments, the IM feedback circuit 122 may include one or more parallel switches $S_{F11} \ldots S_{F1n}$ (generically, $S_{F1x}$), which in turn are series-coupled to respective parallel resistor(s) $R_{F11} \ldots R_{F1n}$ (generically, $R_{F1x}$). With n parallel switch/resistor branches, the tunability of the resistors $R_{F1x}$ is equal to $2^n$ (the total number of switching combinations). Note that the values of the resistors $R_{F1x}$ need not be identical. The IM feedback circuit 122 may be disabled by opening all feedback switches $S_{F1x}$.

In alternative embodiments, capacitor $C_{F1}$, the set of one or more switches $S_{F1x}$, and the set of one or more resistors $R_{F1x}$ may be connected in any series order. In still other embodiments, the switches $S_{F1x}$ may be omitted, thereby permanently coupling the set of one or more resistors $R_{F1x}$ between the input terminal INT and a feedback node in the output signal path of the amplification core 104.

In various gain modes, the in-circuit presence of one or more resistors $R_{F1x}$ allows the Q-factor of the input impedance matching to be reduced, which increases the bandwidth of the LNA circuit at the expense of gain and NF.

An advantage of using a variable or multi-state IM feedback circuit 122 is that multiple resistance values enable multiple gain modes. For instance, LNAs in mobile RF receiver devices may need multiple gain modes depending upon the range of input signal strength at the receiver. In addition, enabling multiple gain modes by using variable or multi-state feedback resistors $R_{F1x}$ may eliminate the need for an output attenuator (common in conventional receiver LNAs).

Further information regarding the IM feedback circuit 122 may be found in U.S. patent application Ser. No. 17/337,227, filed Jun. 2, 2021, entitled "Wideband Multi Gain LNA Architecture", assigned to the assignee of the present invention, the contents of which are hereby incorporated by reference.

D. Output Matching Feedback Circuit. Some embodiments may include an output matching (OM) deQing circuit 124. The OM deQing circuit 124 is shown in FIGS. 1 and 2 as coupled between the amplified-signal terminal AST and the control gate of the common-gate FET $M_{CG}$, and functions to lower the transformation Q of the OIM network 106. More generally, the OM deQing circuit 124 may be coupled to a feedback node in the output signal path of the amplification core 104, which may be the drain of any of the FETS in the amplification core 104 (including within a FET stack 120). Lowering the transformation Q extends the output impedance matching bandwidth of the LNA circuit. This architecture shows a better gain and bandwidth tradeoff in a wide variety of applications compared to other known circuits.

Figure 12:
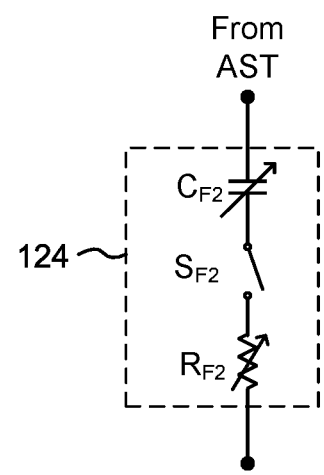
FIG. 12 is a simplified schematic diagram of one embodiment of an output matching feedback circuit.

FIG. 12 is a simplified schematic diagram of one embodiment of an output matching deQing circuit 124. The OM deQing circuit 124 in the illustrated example comprises a DC blocking capacitor $C_{F2}$ series-coupled with a switch $S_{F2}$, which in turn is series-coupled to a resistor $R_{F2}$. In some embodiments, $C_{F2}$ and/or $R_{F2}$ may be adjustable, as shown, or have fixed values. In alternative embodiments, the OM deQing circuit 124 may include one or more parallel switches $S_{F21} \ldots S_{F2n}$ (generically, $S_{F2x}$), which in turn are series-coupled to respective parallel resistor(s) $R_{F21} \ldots R_{F2n}$ (generically, $R_{F2x}$). With n parallel switch/resistor branches, the tunability of the resistors $R_{F2x}$ is equal to $2^n$ (the total number of switching combinations). Note that the values of the resistors $R_{F2x}$ need not be identical. The OM deQing circuit 124 may be disabled by opening all feedback switches $S_{F2x}$.

In alternative embodiments, capacitor $C_{F2}$, the set of one or more switches $S_{F2x}$, and the set of one or more resistors $R_{F2x}$ be connected in any series order. In still other embodiments, the switches $S_{F2x}$ may be omitted, thereby permanently coupling the set of one or more resistors $R_{F2x}$ between the amplified-signal terminal AST and the control gate of the common-gate FET $M_{CG}$.

In various gain modes, the in-circuit presence of one or more resistors $R_{F2x}$ allows the Q-factor of the output impedance matching to be reduced, which increases the bandwidth of the LNA circuit at the expense of gain and NF. For example, switching a single resistor $R_{F2}$ in-circuit or out-of-circuit provides two operation modes, a first mode having a wider output impedance matching bandwidth, and a second mode having a narrower output impedance matching bandwidth but with higher gain than the first mode (assuming that no other LNA circuit elements are concurrently adjusted). As noted above, making $R_{F2}$ variable or enabling more than one resistor value enables additional modes of operation.

More specifically, when switch $S_{F2}$ is CLOSED, $R_{F2}$ couples the amplified-signal terminal AST to the control gate of the common-gate FET $M_{CG}$, effectively placing $R_{F2}$ in parallel with the equivalent resistance $R_D$ of the amplifier core 104 circuit. The in-circuit presence of $R_{F2}$ lowers the impedance, $Z_{DRAIN}$, of the amplifier core 104 as seen at the AST terminal, and reduces the transformation Q of the OIM network 106, where Q is approximately equal to the real part of $Z_{DRAIN}$ divided by the load resistance $R_L$, or $\text{Re}(Z_{DRAIN})/R_L$. Accordingly, the transformation Q is lowered, thereby extending the output impedance matching bandwidth of the LNA circuit. This architecture shows a better gain and bandwidth tradeoff in a wide variety of applications compared to other known circuits. Conversely, when switch $S_{F2}$ is OPEN, $R_{F2}$ is out-of-circuit with respect to $R_D$ in the equivalent circuit, and the transformation Q the OIM network 106 is not reduced.

An advantage of using a variable or multi-state OM deQing circuit 124 is that multiple resistance values enable multiple gain modes. For instance, LNAs in mobile RF receiver devices may need multiple gain modes depending upon the range of input signal strength at the receiver. In addition, enabling multiple gain modes by using variable or multi-state feedback resistors $R2_{Fx}$ may eliminate the need for an output attenuator (common in conventional receiver LNAs).

Further information regarding the OM deQing circuit 124 may be found in U.S. patent application Ser. No. 17/855,386, filed concurrently herewith, entitled "Extended Impedance Matching Wideband LNA Architectures", assigned to the assignee of the present invention, the contents of which are hereby incorporated by reference.

Circuit Embodiments

Circuits and devices in accordance with the present invention may be used alone or in combination with other components, circuits, and devices. For example, the LNA circuits of FIGS. 1, 2, 6A, 7, and 8 may be used with either of the output impedance matching networks 106a, 106b of FIGS. 10A and 10B, respectively, and with or without the IM feedback circuit 122 of FIG. 11 and/or the output matching feedback circuit 124 of FIG. 12.

Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit components or blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

Figure 13:
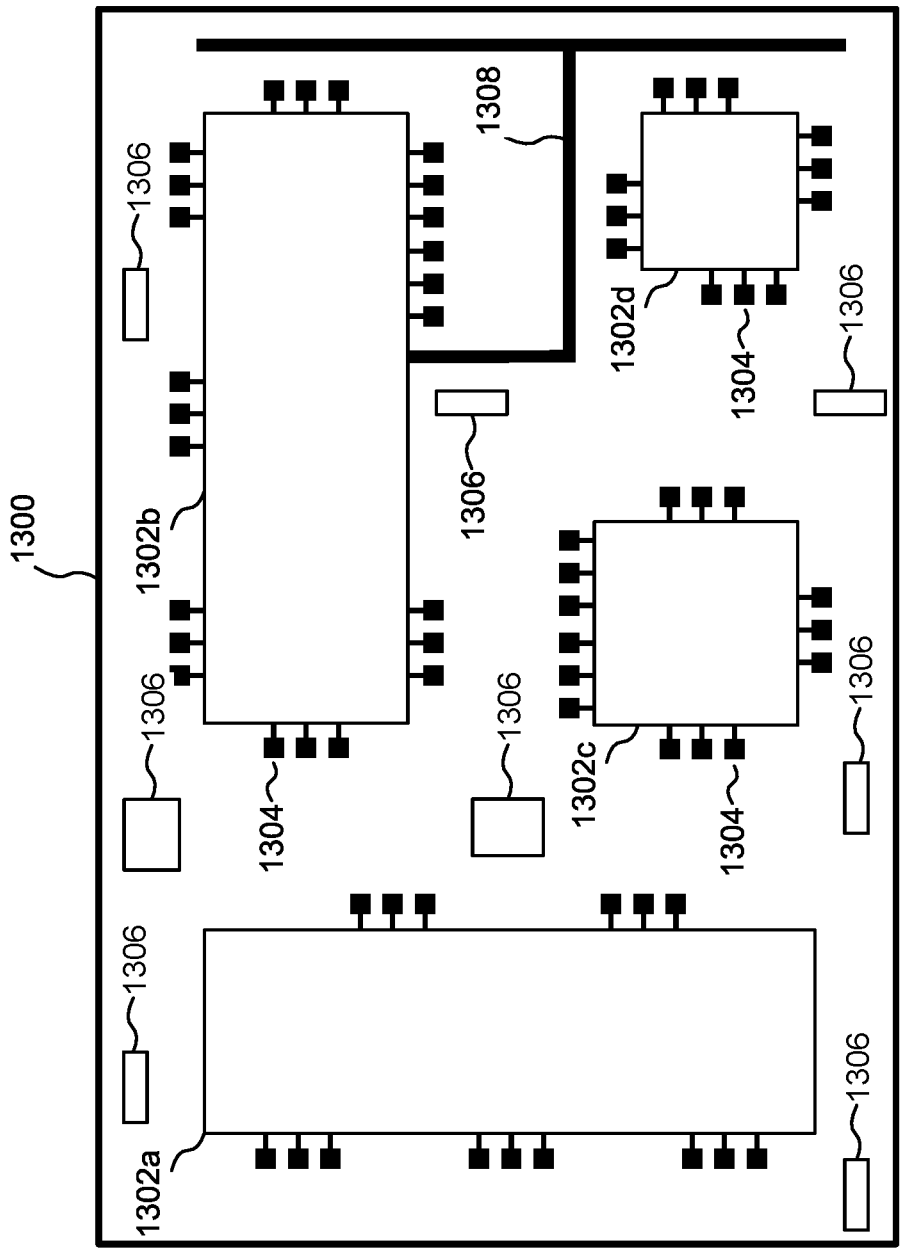
FIG. 13 is a top plan view of a substrate that may be, for example, a printed circuit board or die module substrate (e.g., a thin-film tile).

As one example of further integration of embodiments of the present invention with other components, FIG. 13 is a top plan view of a substrate 1300 that may be, for example, a printed circuit board or die module substrate (e.g., a thin-film tile). In the illustrated example, the substrate 1300 includes multiple ICs 1302a-1302d having terminal pads 1304 which would be interconnected by conductive vias and/or traces on and/or within the substrate 1300 or on the opposite (back) surface of the substrate 1300 (to avoid clutter, the surface conductive traces are not shown and not all terminal pads are labelled). The ICs 1302a-1302d may embody, for example, signal switches, active filters, amplifiers (including one or more LNAs), and other circuitry. For example, IC 1302b may incorporate one or more instances of an LNA like the LNA circuits 100, 200 shown in FIGS. 1 and 2.

The substrate 1300 may also include one or more passive devices 1306 embedded in, formed on, and/or affixed to the substrate 1300. While shown as generic rectangles, the passive devices 1306 may be, for example, filters, capacitors, inductors, transmission lines, resistors, planar antennae elements, transducers (including, for example, MEMS-based transducers, such as accelerometers, gyroscopes, microphones, pressure sensors, etc.), batteries, etc., interconnected by conductive traces on or in the substrate 1300 to other passive devices 1306 and/or the individual ICs 1302a-1302d.

The front or back surface of the substrate 1300 may be used as a location for the formation of other structures. For example, one or more antennae may be formed on or affixed to the front or back surface of the substrate 1300; one example of a front-surface antenna 1308 is shown, coupled to an IC die 1302b, which may include RF front-end circuitry. Thus, by including one or more antennae on the substrate 1300, a complete radio may be created.

System Aspects

Embodiments of the present invention are useful in a wide variety of larger radio frequency (RF) circuits and systems for performing a range of functions, including (but not limited to) impedance matching circuits, RF power amplifiers, RF low-noise amplifiers (LNAs), phase shifters, attenuators, antenna beam-steering systems, charge pump devices, RF switches, etc. Such functions are useful in a variety of applications, such as radar systems (including phased array and automotive radar systems), radio systems (including cellular radio systems), and test equipment.

Radio system usage includes wireless RF systems (including base stations, relay stations, and hand-held transceivers) that use various technologies and protocols, including various types of orthogonal frequency-division multiplexing ("OFDM"), quadrature amplitude modulation ("QAM"), Code-Division Multiple Access ("CDMA"), Time-Division Multiple Access ("TDMA"), Wide Band Code Division Multiple Access ("W-CDMA"), Global System for Mobile Communications ("GSM"), Long Term Evolution ("LTE"), 5G, 6G, and WiFi (e.g., 802.11a, b, g, ac, ax, be) protocols, as well as other radio communication standards and protocols.

Figure 14:
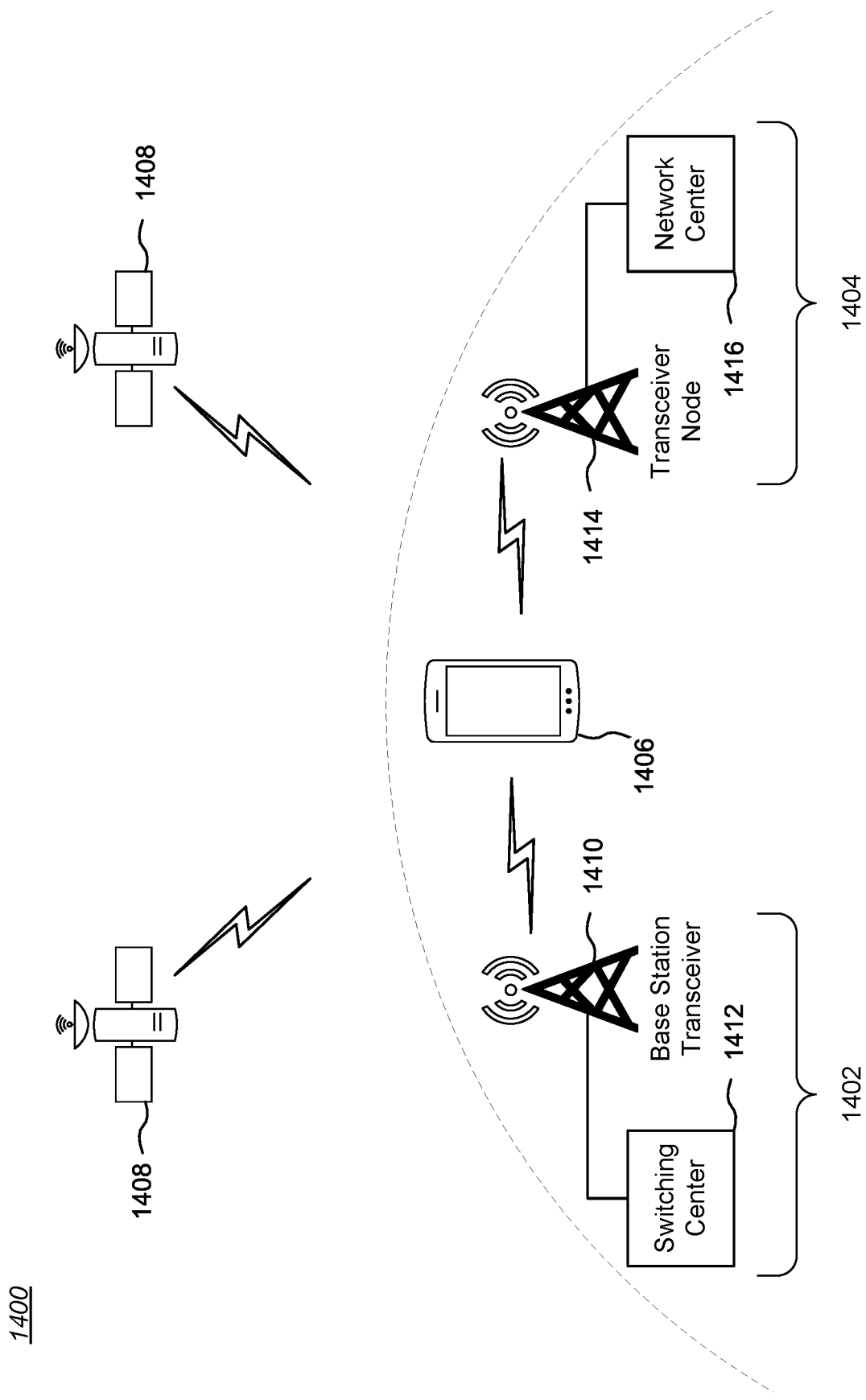
FIG. 14 illustrates an exemplary prior art wireless communication environment comprising different wireless communication systems, and which may include one or more mobile wireless devices.

As an example of wireless RF system usage, FIG. 14 illustrates an exemplary prior art wireless communication environment 1400 comprising different wireless communication systems 1402 and 1404, and which may include one or more mobile wireless devices 1406. A wireless device 1406 may be a cellular phone, a wireless-enabled computer or tablet, or some other wireless communication unit or device. A wireless device 1406 may also be referred to as a mobile station, user equipment, an access terminal, or some other terminology known in the telecommunications industry.

A wireless device 1406 may be capable of communicating with multiple wireless communication systems 1402, 1404 using one or more of telecommunication protocols such as the protocols noted above. A wireless device 1406 also may be capable of communicating with one or more satellites 1408, such as navigation satellites (e.g., GPS) and/or telecommunication satellites. The wireless device 1406 may be equipped with multiple antennas, externally and/or internally, for operation on different frequencies and/or to provide diversity against deleterious path effects such as fading and multi-path interference.

The wireless communication system 1402 may be, for example, a CDMA-based system that includes one or more base station transceivers (BSTs) 1410 and at least one switching center (SC) 1412. Each BST 1410 provides over-the-air RF communication for wireless devices 1406 within its coverage area. The SC 1412 couples to one or more BSTs 1410 in the wireless system 1402 and provides coordination and control for those BSTs 1410.

The wireless communication system 1404 may be, for example, a TDMA-based system that includes one or more transceiver nodes 1414 and a network center (NC) 1416. Each transceiver node 1414 provides over-the-air RF communication for wireless devices 1406 within its coverage area. The NC 1416 couples to one or more transceiver nodes 1414 in the wireless system 1404 and provides coordination and control for those transceiver nodes 1414.

In general, each BST 1410 and transceiver node 1414 is a fixed station that provides communication coverage for wireless devices 1406, and may also be referred to as base stations or some other terminology known in the telecommunications industry. The SC 1412 and the NC 1416 are network entities that provide coordination and control for the base stations and may also be referred to by other terminologies known in the telecommunications industry.

Figure 15:
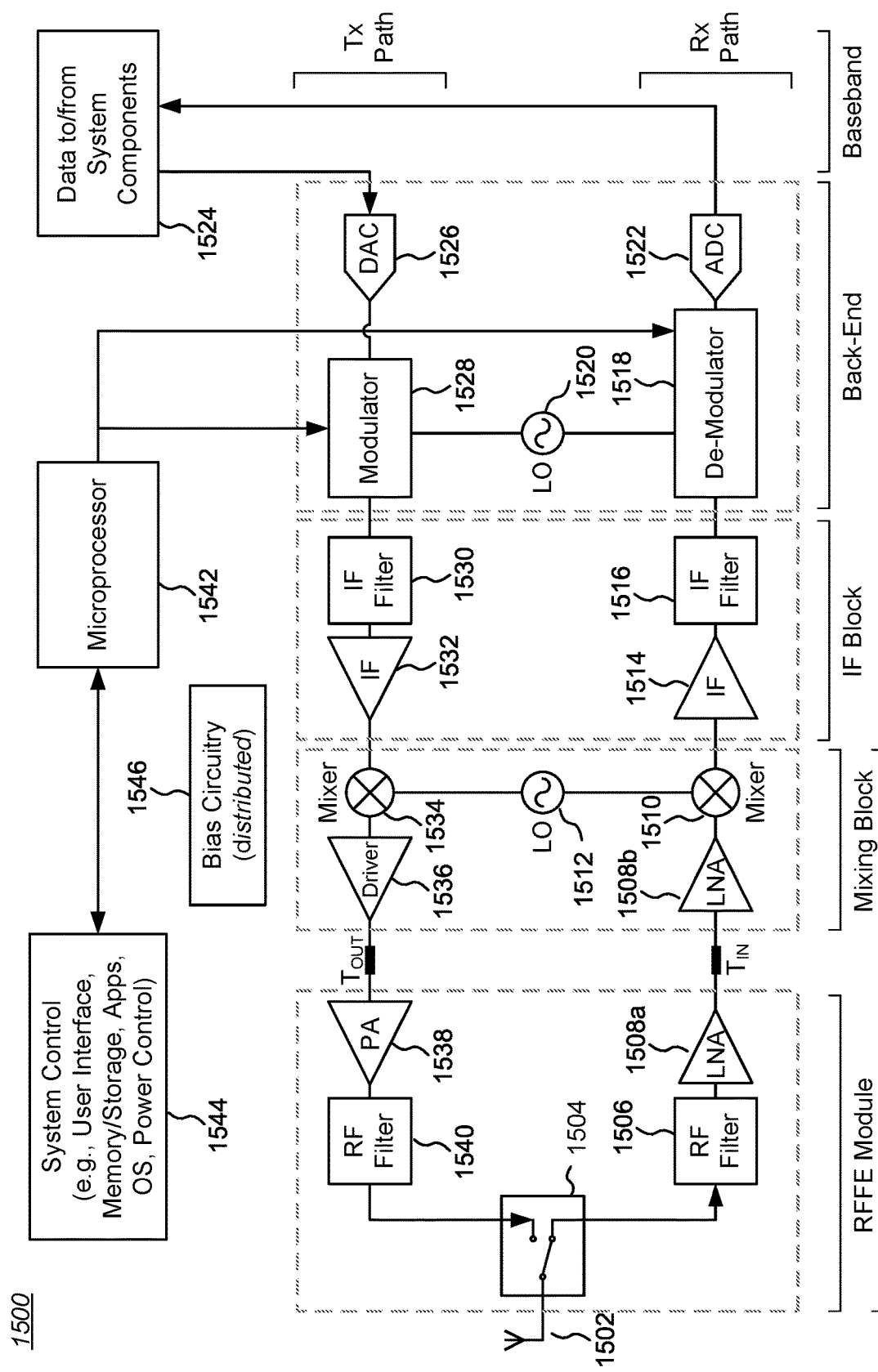
FIG. 15 is a block diagram of a transceiver that might be used in a wireless device, such as a cellular telephone, and which may beneficially incorporate an embodiment of the present invention for improved performance.

An important aspect of any wireless system, including the systems shown in FIG. 14, is in the details of how the component elements of the system perform. FIG. 15 is a block diagram of a transceiver 1500 that might be used in a wireless device, such as a cellular telephone, and which may beneficially incorporate an embodiment of the present invention for improved performance. As illustrated, the transceiver 1500 includes a mix of RF analog circuitry for directly conveying and/or transforming signals on an RF signal path, non-RF analog circuity for operational needs outside of the RF signal path (e.g., for bias voltages and switching signals), and digital circuitry for control and user interface requirements. In this example, a receiver path Rx includes RF Front End, Intermediate Frequency (IF) Block, Back-End, and Baseband sections (noting that in some implementations, the differentiation between sections may be different). The various illustrated sections and circuit elements may be embodied in one die or multiple IC dies. For example, the RF Front End in the illustrated example may include an RFFE module and a Mixing Block, which may be embodied in (or as part of) different IC dies or modules. The different dies and/or modules may be coupled by transmission lines $T_{IN}$ and $T_{OUT}$ (e.g., microstrips, coplanar waveguides, or an equivalent structure or circuit), either or both of which may have, for example, a 50Ω impedance.

The receiver path Rx receives over-the-air RF signals through at least one antenna 1502 and a switching unit 1504, which may be implemented with active switching devices (e.g., field effect transistors or FETs) and/or with passive devices that implement frequency-domain multiplexing, such as a diplexer or duplexer. An RF filter 1506 passes desired received RF signals to at least one low noise amplifier (LNA) 1508a, the output of which is coupled from the RFFE Module to at least one LNA 1508b in the Mixing Block (through transmission line $T_{IN}$ in this example). The LNA(s) 1508b may provide buffering, input matching, and reverse isolation. The LNAs 1508a, 1508b may be instances of any of the LNAs disclosed in FIGS. 1, 2, 6A, 7, and 8.

The output of the LNA(s) 1508b is combined in a corresponding mixer 1510 with the output of a first local oscillator 1512 to produce an IF signal. The IF signal may be amplified by an IF amplifier 1514 and subjected to an IF filter 1516 before being applied to a demodulator 1518, which may be coupled to a second local oscillator 1520. The demodulated output of the demodulator 1518 is transformed to a digital signal by an analog-to-digital converter 1522 and provided to one or more system components 1524 (e.g., a video graphics circuit, a sound circuit, memory devices, etc.). The converted digital signal may represent, for example, video or still images, sounds, or symbols, such as text or other characters.

In the illustrated example, a transmitter path Tx includes Baseband, Back-End, IF Block, and RF Front End sections (again, in some implementations, the differentiation between sections may be different). Digital data from one or more system components 1524 is transformed to an analog signal by a digital-to-analog converter 1526, the output of which is applied to a modulator 1528, which also may be coupled to the second local oscillator 1520. The modulated output of the modulator 1528 may be subjected to an IF filter 1530 before being amplified by an IF amplifier 1532. The output of the IF amplifier 1532 is then combined in a mixer 1534 with the output of the first local oscillator 1512 to produce an RF signal. The RF signal may be amplified by a driver 1536, the output of which is coupled to a power amplifier (PA) 1538 (through transmission line $T_{OUT}$ in this example). The amplified RF signal may be coupled to an RF filter 1540, the output of which is coupled to at least one antenna 1502 through the switching unit 1504.

The operation of the transceiver 1500 is controlled by a microprocessor 1542 in known fashion, which interacts with system control components 1544 (e.g., user interfaces, memory/storage devices, application programs, operating system software, power control, etc.). In addition, the transceiver 1500 will generally include other circuitry, such as bias circuitry 1546 (which may be distributed throughout the transceiver 1500 in proximity to transistor devices), electrostatic discharge (ESD) protection circuits, testing circuits (not shown), factory programming interfaces (not shown), etc.

In modern transceivers, there are often more than one receiver path Rx and transmitter path Tx, for example, to accommodate multiple frequencies and/or signaling modalities. Further, as should be apparent to one of ordinary skill in the art, some components of the transceiver 1500 may be positioned in a different order (e.g., filters) or omitted. Other components can be (and often are) added, such as (by way of example only) additional filters, impedance matching networks, variable phase shifters/attenuators, power dividers, etc.

As discussed above, the current invention improves IC area savings, manufacturing cost savings, wider impedance matching bandwidth, and flatter gain response of amplifier circuit modules or blocks. As a person of ordinary skill in the art will understand, the system architecture is beneficially impacted by the current invention in critical ways, including better dynamic range, better sensitivity, lower cost, and wider bandwidth. In order to comply with system standards or customer requirements, the current invention is therefore critical to the overall solution shown in FIG. 15. The current invention therefore specifically defines a system-level embodiment that is creatively enabled by its inclusion in that system.

Methods

Figure 16:
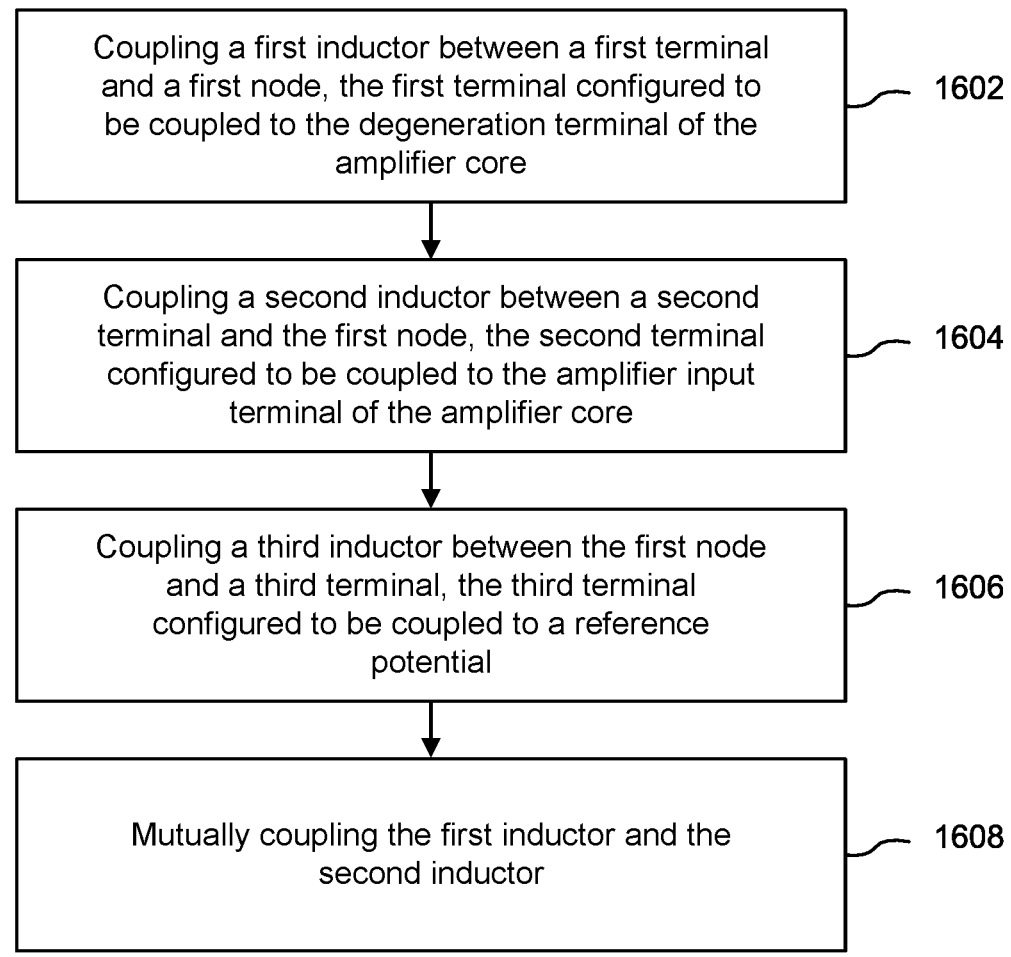
FIG. 16 is a process flow chart showing a first method for providing wideband input impedance matching for an amplifier core.

Another aspect of the invention includes methods for wideband input impedance matching for an amplifier core having an amplifier input terminal configured to receive a radiofrequency (RF) signal, an amplified-signal terminal, and a degeneration terminal. For example, FIG. 16 is a process flow chart 1600 showing a first method for providing wideband input impedance matching for an amplifier core. The method includes: coupling a first inductor between a first terminal and a first node, the first terminal configured to be coupled to the degeneration terminal of the amplifier core (Block 1602); coupling a second inductor between a second terminal and the first node, the second terminal configured to be coupled to the amplifier input terminal of the amplifier core (Block 1604); and coupling a third inductor between the first node and a third terminal, the third terminal configured to be coupled to a reference potential (Block 1606); mutually coupling the first inductor and the second inductor (Block 1608).

Figure 17:
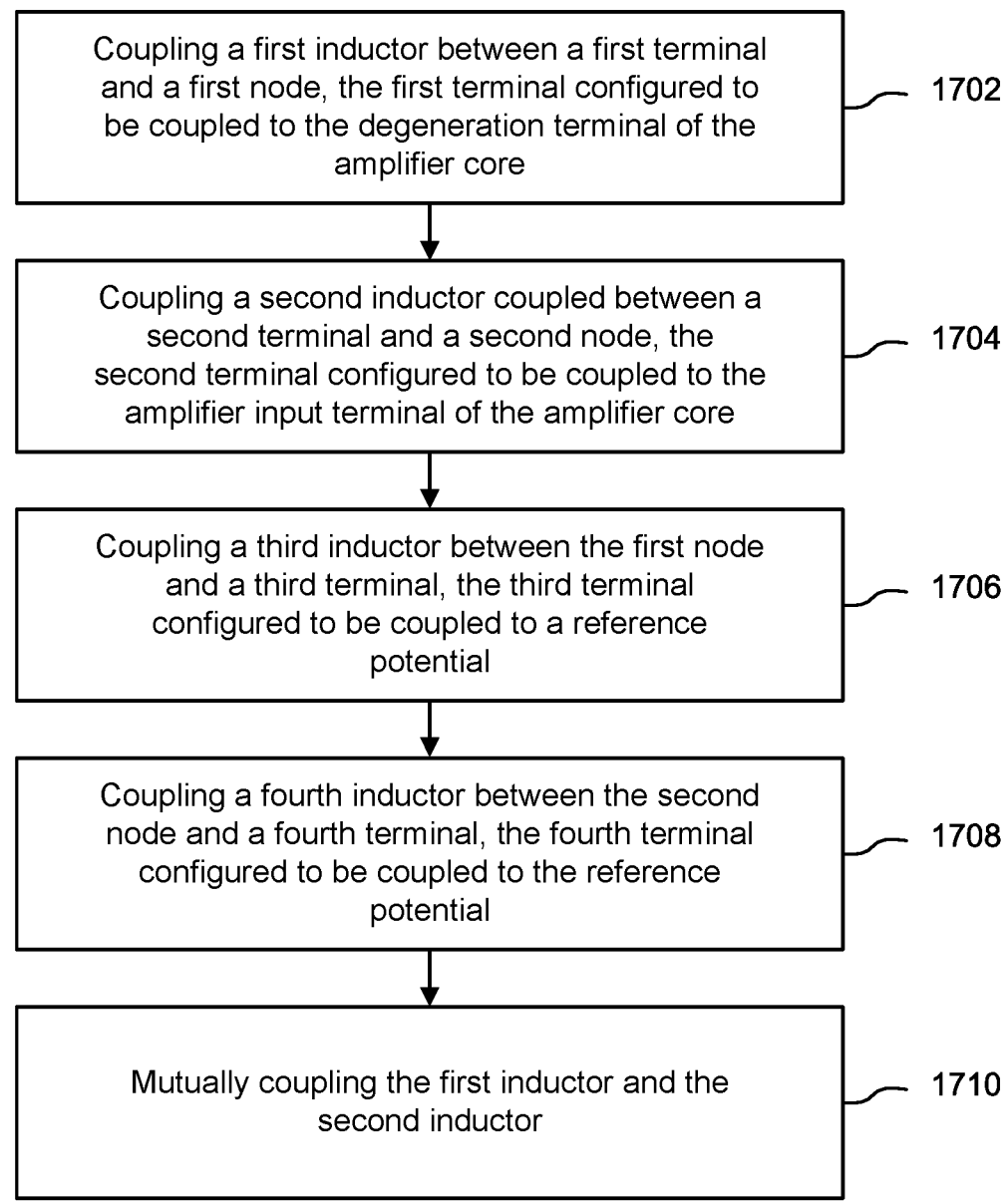
FIG. 17 is a process flow chart showing a second method for providing wideband input impedance matching for an amplifier core.

As another example, FIG. 17 is a process flow chart 1700 showing a second method for providing wideband input impedance matching for an amplifier core. The method includes: coupling a first inductor between a first terminal and a first node, the first terminal configured to be coupled to the degeneration terminal of the amplifier core (Block 1702); coupling a second inductor coupled between a second terminal and a second node, the second terminal configured to be coupled to the amplifier input terminal of the amplifier core (Block 1704); coupling a third inductor between the first node and a third terminal, the third terminal configured to be coupled to a reference potential (Block 1706); coupling a fourth inductor between the second node and a fourth terminal, the fourth terminal configured to be coupled to the reference potential (Block 1708); and mutually coupling the first inductor and the second inductor (Block 1710).

Additional aspects of the above method may include one or more of the following: wherein the mutual coupling of the first inductor and the second inductor is negative; wherein the mutual coupling of the first inductor and the second inductor is positive; wherein the amplifier core, the first inductor, and the second inductor are co-fabricated on an integrated circuit die; wherein the amplifier core is fabricated on an integrated circuit die, and the first inductor and the second inductor are located external to the integrated circuit die; wherein the first inductor comprises a plurality of parallel inductances; wherein the first inductor and the second inductor comprise mutually coupled segments of an integrated circuit transformer coil; wherein the first inductor comprises a first selectable inductance coupled in series with a second selectable inductance; further including a series inductor coupled between the input terminal of the amplifier core and a radio frequency input terminal of the amplifier core, wherein the second terminal of the wideband input impedance matching network is configured to be coupled to the input terminal of the amplifier core through the series inductor; and/or wherein the second inductor and the first selectable inductance are mutually coupled in a first selectable state, and the second inductor and a series sum of the first and second selectable inductances are mutually coupled in a second selectable state.

Fabrication Technologies & Options

While the example embodiments are LNAs, the inventive circuits and methods may also be applied to other types of amplifiers, such as power amplifiers.

Additional well-known circuit elements that might be included in some applications, such as DC block capacitors, additional impedance matching circuitry, and additional filters, are omitted for clarity. Note also that a circuit component that is characterized as "adjustable" may have its value selected from a number of possible component value settings and fixed during fabrication, when assembled in a circuit module, during factory testing, or in the field (e.g., by burning or "blowing" fusible links), or may have its value be dynamically varied, tuned, or programmatically set, such as in response to other circuitry (e.g., temperature compensation and/or power control circuitry) or in response to generated or received command signals.

The modes of operation of the inventive LNA circuits may be set by a control circuit (not shown) in known fashion. The control circuit may also connect to the components that are adjustable to select different component values (e.g., capacitance, resistance, inductance) for different gain states, for example, to help input and/or output impedance matching or vary gain versus linearity and/or NF in some modes of operation.

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions may be greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A wideband coupled input impedance matching network including:
   (a) a first inductor coupled between a first terminal and a first node, the first terminal configured to be coupled to a degeneration terminal of an amplifier core;
   (b) a second inductor coupled between a second terminal and the first node, the second terminal configured to be coupled to an input terminal of the amplifier core; and
   (c) a third inductor coupled between the first node and a third terminal, the third terminal configured to be coupled to a reference potential;
   wherein the first inductor and the second inductor are mutually coupled.

2. The invention of claim 1, wherein the mutual coupling of the first inductor and the second inductor is negative.

3. The invention of claim 1, wherein the mutual coupling of the first inductor and the second inductor is positive.

4. The invention of claim 1, wherein the amplifier core, the first inductor, and the second inductor are co-fabricated on an integrated circuit die.

5. The invention of claim 1, wherein the amplifier core is fabricated on an integrated circuit die, and the first inductor and the second inductor are located external to the integrated circuit die.

6. The invention of claim 1, wherein the first inductor comprises a plurality of parallel inductances.

7. The invention of claim 1, wherein the first inductor and the second inductor comprise mutually coupled segments of an integrated circuit transformer coil.

8. The invention of claim 1, wherein the first inductor comprises a first selectable inductance coupled in series with a second selectable inductance.

9. The invention of claim 8, wherein the second inductor and the first selectable inductance are mutually coupled in a first selectable state, and the second inductor and a series sum of the first and second selectable inductances are mutually coupled in a second selectable state.

10. The invention of claim 1, further including a series inductor coupled between the input terminal of the amplifier core and a radio frequency input terminal of the amplifier core, wherein the second terminal of the wideband input impedance matching network is configured to be coupled to the input terminal of the amplifier core through the series inductor.

* * * * *